(12) United States Patent
Hasegawa

(10) Patent No.: US 6,867,952 B2
(45) Date of Patent: Mar. 15, 2005

(54) MAGNETIC SENSING ELEMENT WITH ESD RESISTANCE IMPROVED BY ADJUSTING THE LENGTHS OF ANTIFERROMAGNETIC LAYERS AND FREE LAYER IN THE HEIGHT DIRECTION

(75) Inventor: Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 139 days.

(21) Appl. No.: 10/345,881

(22) Filed: Jan. 16, 2003

(65) Prior Publication Data

US 2003/0179519 A1 Sep. 25, 2003

(30) Foreign Application Priority Data

Jan. 22, 2002 (JP) .................................. 2002-012786

(51) Int. Cl.[7] .............................................. G11B 5/39
(52) U.S. Cl. ............................................. 360/324.12
(58) Field of Search ................................... 360/324.12

(56) References Cited

U.S. PATENT DOCUMENTS 6,074,767 A * 6/2000 Lin .............................. 428/692
6,381,107 B1 4/2002 Redon et al.

FOREIGN PATENT DOCUMENTS

JP 7-114717 5/1995

* cited by examiner

Primary Examiner—A. J. Heinz
(74) Attorney, Agent, or Firm—Brinks Hofer Gilson & Lione

(57) ABSTRACT

A magnetic sensing element having a reduced electrical resistance and a large exchange anisotropic magnetic field between a free layer and antiferromagnetic layers for exchange biasing is provided. The magnetic sensing element includes second antiferromagnetic layers and a free magnetic layer, and the length of the second antiferromagnetic layers in a height direction in side regions disposed at the lateral sides of a track width region is larger than the length of the free magnetic layer in the height direction in the track width region.

12 Claims, 18 Drawing Sheets

MAGNETIC SENSING ELEMENT WITH ESD RESISTANCE IMPROVED BY ADJUSTING THE LENGTHS OF ANTIFERROMAGNETIC LAYERS AND FREE LAYER IN THE HEIGHT DIRECTION

BACKGROUND OF THE INVENTION

1. Field of the Invention

The present invention generally relates to magnetic sensing elements for use in hard disk devices or magnetic sensors. In particular, it relates to a magnetic sensing element having excellent resistance to electrostatic discharge damage and electrical overload, i.e., resistance to soft electrostatic discharge damage (ESD), when the size of the element is reduced, and to a method for making the magnetic sensing element.

2. Description of the Related Art

FIG. 24 is a cross-sectional view showing the structure of a conventional magnetic sensing element viewed from a face that opposes a recording medium.

The magnetic sensing element shown in FIG. 24 is a spin-valve magnetic element, which is a type of giant magnetoresistive (GMR) element, and detects a recording magnetic field from a recording medium such as a hard disk.

The magnetic sensing element is constituted from a lower shield layer 1, a lower gap layer 2, a first antiferromagnetic layer 3, a pinned magnetic layer 4, a nonmagnetic material layer 5, a free magnetic layer 6, second antiferromagnetic layers 7, electrode layers 8, an insulating layer 9, an upper gap layer 10, and an upper shield layer 11.

Generally, the first antiferromagnetic layer 3 and the second antiferromagnetic layers 7 are composed of a Fe—Mn (iron-manganese) alloy, the pinned magnetic layer 4 and the free magnetic layer 6 are composed of a Ni—Fe (nickel-iron) alloy, the nonmagnetic material layer 5 is composed of copper (Cu), and the electrode layers 8 are composed of chromium (Cr). The lower shield layer 1 and the upper shield layer 11 are composed of a NiFe alloy and the lower gap layer 2, the insulating layer 9, and the upper gap layer 10 are composed of alumina.

The pinned magnetic layer 4 is magnetized and is put to a single domain state in the Y direction in the drawing by the exchange anisotropic magnetic field with the first antiferromagnetic layer 3. The Y direction is the direction of a leakage magnetic field from a recording medium and is the height direction.

The free magnetic layer 6 is put to a single magnetic domain state in the X direction by the exchange anisotropic magnetic field with the second antiferromagnetic layers 7. In other words, the free magnetic layer 6 is put to a single magnetic domain state in the X direction by exchange biasing. In exchange biasing, no dead zone, i.e., the zone that cannot detect magnetic fields, exists in the optical track width region; accordingly, the magnetic track width can readily coincide with the optical track width. Moreover, the demagnetizing field generated in the free magnetic layer 6 can be decreased.

In this magnetic sensing element, a detection current, i.e., a sensing current, is supplied from the electrode layers 8 to the free magnetic layer 6, the nonmagnetic material layer 5, and the pinned magnetic layer 4 via the second antiferromagnetic layers 7. Since a recording medium, such as a hard disk, moves in the Z direction and a leakage magnetic field from the recording medium is applied in the Y direction, the magnetization direction of the free magnetic layer 6 shifts from the X direction toward the Y direction. The shift in the magnetization direction of the free magnetic layer 6 with respect to the magnetization direction of the pinned magnetic layer 4 changes the electrical resistance, thereby producing a magnetoresistive effect. Changes in electrical resistance result in voltage change, and the leakage magnetic field from the recording medium is detected based on the voltage change.

FIG. 25 is a plan view of the second antiferromagnetic layers 7 and the free magnetic layer 6 included in the magnetic sensing element of FIG. 24 viewed from the top of the drawing in FIG. 24, i.e., viewed in the direction opposite to the Z direction.

No investigation has been made on planar shapes of the second antiferromagnetic layers 7 and the free magnetic layer 6 of the spin valve magnetic sensing element of an exchange bias type. Particularly, the shapes and the dimensions of these layers at the portions inward from the opposing face in the Y direction have been out of the consideration.

Conventionally, as shown in FIG. 25, rear faces 7a of the second antiferromagnetic layers 7 and a rear face 6a of the free magnetic layer 6 have been formed as planes parallel to the X direction, i.e., the track width direction. Moreover, the distance between the opposing face and the rear faces 7a of the second antiferromagnetic layers 7 has been the same as the distance between the opposing face and the rear face 6a of the free magnetic layer 6, as indicated by reference character hl.

However, the magnetic sensing element including the second antiferromagnetic layers 7 and the free magnetic layer 6 arranged as above significantly suffers from a problem of ESD, in particular, soft ESD, when the size of the magnetic sensing element is reduced.

As the element becomes smaller, the second antiferromagnetic layers 7 that function as a path for power supply become smaller, resulting in an increase in the resistance. Thus, a large amount of heat is generated at the junctions between the free magnetic layer 6 and the second antiferromagnetic layers 7 when the magnetic sensing element comes into contact with an object with static charges or when a transient current flows during switching.

In the magnetic sensing element shown in FIG. 25, the transient current flows in the same direction as the sensing current, i.e., the X direction or a direction antiparallel to the X direction. Accordingly, the magnetic field generated by the transient current is in a direction perpendicular to the magnetization direction of the free magnetic layer 6.

Because of the heat and the generated magnetic field perpendicular to the magnetization direction of the free magnetic layer 6, the intensity and direction of the exchange anisotropic magnetic field between the free magnetic layer 6 and the second antiferromagnetic layers 7 are shifted. Although the magnetic sensing element does not break, the output symmetry is degraded, and output is decreased. Such phenomena are generically called soft electrostatic discharge damage (ESD).

SUMMARY OF THE INVENTION

An object of the present invention is to overcome the problems encountered in the prior art by providing an exchange-bias magnetic sensing element that generates a smaller amount of heat even when the element is miniaturized, thereby preventing degradation of the output symmetry and a decrease in the output. Another object of the present invention is to provide a method for making the magnetic sensing element.

An aspect of the present invention provides a magnetic sensing element including a laminate and a pair of second antiferromagnetic material layer. The laminate includes a first antiferromagnetic layer; a pinned magnetic layer on the first antiferromagnetic layer; a nonmagnetic material layer on the pinned magnetic layer; and a free magnetic layer on the nonmagnetic material layer. The second antiferromagnetic layers are disposed on the free magnetic layer and are separated from each other in a track width direction by a gap therebetween. The length of the second antiferromagnetic layers in a height direction is larger than the length of the free magnetic layer in the height direction in a track width region.

In the magnetic sensing element of the present invention, the magnetization direction of the pinned magnetic layer is pinned in one direction by an exchange anisotropic magnetic field generated between the first antiferromagnetic layer and the pinned magnetic layer. The free magnetic layer is put to a single-magnetic-domain state by an exchange anisotropic magnetic field generated between the second antiferromagnetic layers and the free magnetic layer. The magnetization direction of the free magnetic layer is orthogonal to the magnetization direction of the pinned magnetic layer when no external magnetic field is applied.

In the present invention, the length of the second antiferromagnetic layers in the height direction is larger than the length of the free magnetic layer in the height direction in a track width region. In this manner, the cross-sectional area of the second antiferromagnetic layers in a direction perpendicular to the layer surface is increased, thereby decreasing the electrical resistance of the second antiferromagnetic layers in a direction parallel to the layer surface.

Moreover, because the area of the second antiferromagnetic layers in a direction parallel to the layer surface is increased, the heat releasing property of the second antiferromagnetic layers is also enhanced.

Accordingly, when the magnetic sensing element comes into contact with a charged object or when a transient current flows during switching, the amount of heat generated at the junctions between the second antiferromagnetic layers and the free magnetic layer can be reduced. Furthermore, the intensity and the magnetization direction of the exchange anisotropic magnetic field generated between the second antiferromagnetic layers and the free magnetic layer can be prevented from changing. Thus, according to the present invention, the resistance to soft ESD can be enhanced, and degradation in the output symmetry and a decrease in output can be prevented.

The volume of the second antiferromagnetic layers also increases as the length of the second antiferromagnetic layer in the height direction increases. Thus, when the free magnetic layer is formed at small dimensions, for example, a length in the height direction of 0.2 $\mu$m or less, segmentation of the crystal grains in the second antiferromagnetic layers can be inhibited, and the average crystal grain size of the crystals in the second antiferromagnetic layers remains large. Accordingly, the anisotropic energy of the second antiferromagnetic layers and thus the exchange anisotropic magnetic field between the second antiferromagnetic layers and the free magnetic layer can be increased. Moreover, the blocking temperature can be increased, and the intensity and the direction of the exchange anisotropic magnetic field between the second antiferromagnetic layers and the free magnetic layer due to generation of heat can be prevented from changing. Note that the blocking temperature is a temperature at which the exchange coupling magnetic field between the second antiferromagnetic layers and the free magnetic layer is lost.

Preferably, at least part of an inner end face of each of the second antiferromagnetic layers is a vertical face, a curved face, or a slope that extends in the height direction. The vertical faces, the curved faces, or the slopes of the second antiferromagnetic layers are preferably separated from each other with a gap corresponding to a track width therebetween. The length of the vertical faces, the curved faces, or the slopes in the height direction is preferably larger than the length of the free magnetic layer in the height direction in the track width region.

Note that when the length of the vertical faces, the curved faces, or the slopes of the second antiferromagnetic layers in the height direction is 1 $\mu$m or more, the change in asymmetry of the magnetic sensing element can be reduced to 10% or less at an applied voltage of 20 V in a soft ESD resistance test using a human body model. This test will be described below in detail.

Preferably, the vertical faces, the curved faces, or the slopes of the second antiferromagnetic layers have a length in the height direction of 10 $\mu$m or less. At a length in the height direction exceeding 10 $\mu$m, short-circuiting between the second antiferromagnetic layers and an upper shield layer, which may be formed on the magnetic sensing element of the present invention, may readily occur.

Preferably, in the present invention, the length of the free magnetic layer in the height direction at side regions at the lateral sides of the track width region is larger than the length of the free magnetic layer in the height direction in the track width region.

In this manner, the area of the junctions between the second antiferromagnetic layers and the free magnetic layers increases, and thus the intensity of the exchange anisotropic magnetic field between the second antiferromagnetic layers and the free layer increases. Note that the term "track width region" of the laminate means the region of the laminate sandwiched by the second antiferromagnetic layers.

In the present invention, the electrical resistance of the overlapping portions between the second antiferromagnetic layers and the free magnetic layer in a direction parallel to the layer surface is small. Thus, the amount of heat generated at the junctions between the second antiferromagnetic layers and the free magnetic layers due to coming into contact with a charge object or due to flowing of a transient current during switching is small. As a result, the intensity and the direction of the exchange anisotropic magnetic field between the second antiferromagnetic layers and the free magnetic layer can be prevented from changing. The present invention can prevent degradation in symmetry of the output and a decrease in the output.

Moreover, since the area of the free magnetic layer in a direction parallel to the layer surface increases, the heat-releasing property of the free magnetic layer also increases.

In the present invention, the overlapping portions between the second antiferromagnetic layers and the free magnetic layer has a smaller sensing-current density. Thus, the magnetic field generated by the sensing current is also small, thereby preventing the intensity and the direction of the exchange anisotropic magnetic field generated between the second antiferromagnetic layers and the free magnetic layer.

In the sensing current that flows in the magnetic sensing element, the current that flows in the region sandwiched by inner end faces of the second antiferromagnetic layers directly contributes to the detection of the magnetic field. The current diverging from the junctions between the second antiferromagnetic layers and the free magnetic layer to the side regions of the laminate is preferably small.

In the present invention, the amount of current diverging from the junctions to the side regions of the laminate can be decreased, thereby preventing side reading. Note that the "side reading" is detection of an external magnetic field (a leakage magnetic field from a recording medium) by the side regions disposed at the lateral sides of the track width region of the magnetic sensing element.

Preferably, at least part of an inner end face of the free magnetic layer at the side regions is a vertical face, a curved face, or a slope that extends in the height direction, and the length of the vertical face, the curved face, or the slope of the free magnetic layer in the height direction is larger than the length of the free magnetic layer in the height direction in the track width region.

It has been found by that when the length of the vertical face, the curved face, or the slope of the free magnetic layer in the height direction is 1 μm or more, the change in asymmetry of the magnetic sensing element can be reduced to 10% or less at an applied voltage of 20 V in a soft ESD resistance test using a human body model. This test will be described below in detail.

Preferably, the vertical face, the curved face, or the slope of the free magnetic layer has a length in the height direction of 10 μm or less. At a length in the height direction exceeding 10 μm, short-circuiting between the free magnetic layer or the second antiferromagnetic layers and an upper shield layer, which may be formed on the magnetic sensing element of the present invention, may readily occur.

Preferably, the second antiferromagnetic layers completely cover portions of the free magnetic layer at the side regions. In this manner, the exchange anisotropic magnetic field between the second antiferromagnetic layers and the free magnetic layer can be maximized, and the intensity and the direction of the exchange anisotropic magnetic field between the second antiferromagnetic layers and the free magnetic layer can be prevented from changing.

Preferably, the magnetic sensing element of the present invention further includes electrode layers on the second antiferromagnetic layers. The electrode layers are preferably composed of a conductive material having a resistivity lower than that an antiferromagnetic material of the second antiferromagnetic layers. The electrode layers preferably completely cover top faces of the second antiferromagnetic layers.

The thickness of the second antiferromagnetic layers or the thickness of the electrode layers at the side regions may be smaller in the regions behind a rear end face of the free magnetic layer in the height direction than in the regions from a face of the magnetic sensing element opposing a recording medium up to the rear end face of the free magnetic layer. This structure can be fabricated by methods described below.

Another aspect of the present invention provides a method for making a magnetic sensing element including the steps of (a) forming a laminate on a substrate, the laminate comprising a first antiferromagnetic layer, a pinned magnetic layer on the first antiferromagnetic layer, a nonmagnetic material layer on the pinned magnetic layer, and a free magnetic layer on the nonmagnetic material layer; (b) performing first field annealing of the laminate to generate an exchange coupling magnetic field between the first antiferromagnetic layer and the pinned magnetic layer so as to pin the magnetization direction of the pinned magnetic layer; (c) forming a pair of second antiferromagnetic layers on the free magnetic layer, the second antiferromagnetic layers having a length in the height direction larger than a designed final length of the free magnetic layer in the height direction, the second antiferromagnetic layers being separated from each other in a track width direction with a gap therebetween; (d) performing second field annealing of the laminate and the second antiferromagnetic layers to generate an exchange coupling magnetic field between the second antiferromagnetic layers and the free magnetic layer so as to pin the magnetization directions of two side portions of the free magnetic layer in a direction orthogonal to the magnetization direction of the pinned magnetic layer; and (e) forming a mask on the second ferromagnetic layers and on the laminate in the track width region and removing part of the laminate that is not covered by the mask.

Preferably, the method further includes, subsequent to the step (c), step (f) of forming electrode layers on the second antiferromagnetic layers, the electrode layers comprising a conductive material having a resistivity lower than that of an antiferromagnetic material of the second antiferromagnetic layers.

In forming the electrode layers, the method preferably includes, instead of the step (e), step (g) of forming a mask on the electrode layers and on the laminate in the track width region and removing part of the laminate that is not covered by the mask.

In the step (g), part of the electrode layers not covered by the mask may be milled but may not be completely removed. In performing the step (g), the thickness of the electrode layers is preferably formed to be larger than the thickness of the laminate during the step (f).

Preferably, in the step (c), a vertical face, a curved face, or a slope that extends in the height direction is formed in at least part of an inner end face of each second antiferromagnetic layer, the vertical faces, the curved faces, or the slopes of the second antiferromagnetic layers being separated from each other by a gap corresponding to a track width therebetween. Preferably, in the step (e), the length of the vertical faces, curved faces, or slopes of the second antiferromagnetic layers in the height direction is larger than the length of the region of the laminate that is covered by the mask in the height direction.

Yet another aspect of the present invention provides a method for making a magnetic sensing element comprising the steps of (h) forming a laminate on a substrate, the laminate comprising a first antiferromagnetic layer, a pinned magnetic layer on the first antiferromagnetic layer, a nonmagnetic material layer on the pinned magnetic layer, and a free magnetic layer on the nonmagnetic material layer; (i) performing a first field annealing of the laminate to generate an exchange coupling magnetic field between the first antiferromagnetic layer and the pinned magnetic layer so as to pin the magnetization direction of the pinned magnetic layer; (j) forming a pair of second antiferromagnetic layers, which are separated from each other in a track width direction by a gap therebetween, on the free magnetic layer, the length of the second antiferromagnetic layers in the height direction being larger than the length of the free magnetic layer in the height direction; and (k) performing a second field annealing of the laminate and the second antiferromagnetic layers to generate exchange coupling magnetic fields between the second antiferromagnetic layers and the free magnetic layer so as to pin the magnetization directions of two side regions of the free magnetic layer in a direction orthogonal to the magnetization direction of the pinned magnetic layer.

Preferably, in the step (j), a vertical face, a curved face, or a slope that extends in the height direction is formed in at least part of an inner end face of each second antiferromagnetic layer, the vertical faces, the curved faces, or the slopes of the second antiferromagnetic layers being separated from each other by a gap corresponding to a track width therebetween. Particularly, in the step (c) or (j) described above, the vertical faces, the curved faces, or the slopes of the second antiferromagnetic layers are preferably formed to have a length in the height direction of 1 μm or more.

Preferably, in the step (c) or (j) described above, the vertical faces, the curved faces, or the slopes of the second antiferromagnetic layers are formed to have a length in the height direction of 10 μm or less. In this manner, the length of the vertical faces, curved faces, or slopes of the free magnetic layer in the height direction can be reduced to 10 μm or less in a completed magnetic sensing element.

DESCRIPTION OF THE PREFERRED EMBODIMENTS

First Embodiment

Figure 1:
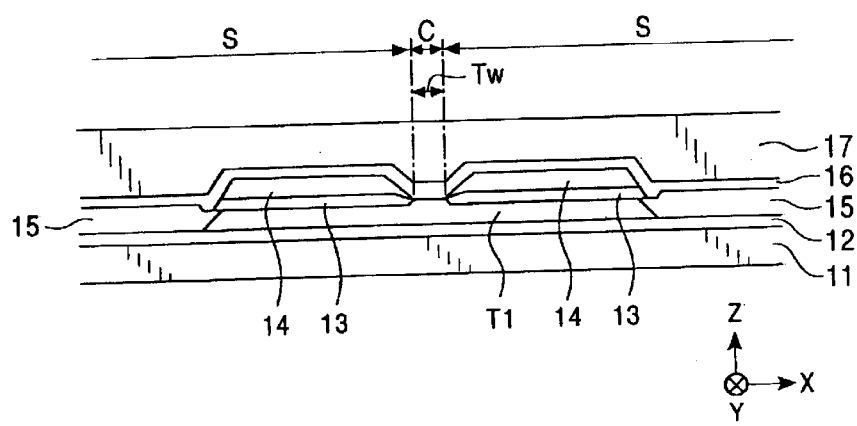
FIG. 1 is a partial front view of a magnetic sensing element according to a first embodiment of the present invention when viewed from a face that opposes a recording medium (hereinafter, the opposing face)

FIG. 1 is a partial front view of a magnetic sensing element according to a first embodiment of the present invention when viewed from a face that opposes a recording medium (hereinafter, the opposing face).

The magnetic sensing element shown in FIG. 1 is a magnetoresistive (MR) head for reading an external signal recorded on a recording medium. The opposing face is perpendicular to the surfaces of the layers that constitute the magnetic sensing element and is parallel to the magnetization direction of the free magnetic layer of the magnetic sensing element when no external magnetic field is applied. In FIG. 1, the opposing face is a flat plane parallel to the X–Z plane.

If the magnetic sensing element is applied to a floating magnetic head, the opposing face constitutes the air-bearing surface (ABS).

The magnetic sensing element is, for example, formed on a trailing end face of a slider composed of alumina titanium carbide ($Al_2O_3$—TiC). The slider is bonded on a elastic supporting member composed of stainless steel or the like at the face opposite of the face that opposes a recording medium so as to form a magnetic head device.

Note that the term "track width direction" refers to the direction of the width of a region having magnetization that rotates in response to an external magnetic field. For example, the track width direction is the magnetization direction of a free magnetic layer when no external field is applied, i.e., the X direction in the drawing. The width of the free magnetic layer in the track width direction defines the track width Tw of the magnetic sensing element.

A recording medium moves in the Z direction in the drawing. The leakage magnetization from the recording medium is in the Y direction in the drawing.

Referring to FIG. 1, a lower shield layer 11 is formed on a base layer (not shown), which is formed on a substrate (also not shown) and composed of an insulating material such as alumina. A lower gap layer 12 is formed on the lower shield layer 11. A laminate T1 formed by stacking a first antiferromagnetic layer, a pinned magnetic layer, a nonmagnetic material layer, and a free magnetic layer is disposed on the lower gap layer 12.

The structure of the laminate T1 will be described in detail below. The topmost layer of the laminate T1 is either a free magnetic layer or a nonmagnetic layer formed on the free magnetic layer.

A pair of second antiferromagnetic layers 13 is formed on the top of the laminate T1, i.e., on the free magnetic layer or on the nonmagnetic layer. The second antiferromagnetic layers 13 are separated from each other in the track width direction by a gap therebetween. The length of the gap corresponds to the track width Tw. Electrode layers 14 are stacked on the second antiferromagnetic layers 13. An insulating layer 15 is disposed at the two sides of and behind the laminate T1.

As shown in FIG. 1, the region of the laminate T1 sandwiched by the second antiferromagnetic layers 13 is a track width region C, and the regions at the lateral sides of the track width region C are side regions S.

An upper gap layer 16 is formed over the track width region C of the laminate T1, the electrode layers 14, and the insulating layer 15. An upper shield layer 17 is formed over the upper gap layer 16.

The lower shield layer 11 and the upper shield layer 17 are composed of a magnetic material such as NiFe. Preferably, the lower shield layer 11 and the upper shield layer 17 have an easy axis oriented in the track width direction, i.e., the X direction in the drawing. The lower shield layer 11 and the upper shield layer 17 are formed by sputtering, vapor deposition, or electrolytic plating.

The lower gap layer 12, the insulating layer 15, and the upper gap layer 16 are composed of nonmagnetic inorganic material such as $Al_2O_3$ and $SiO_2$.

Figure 2:
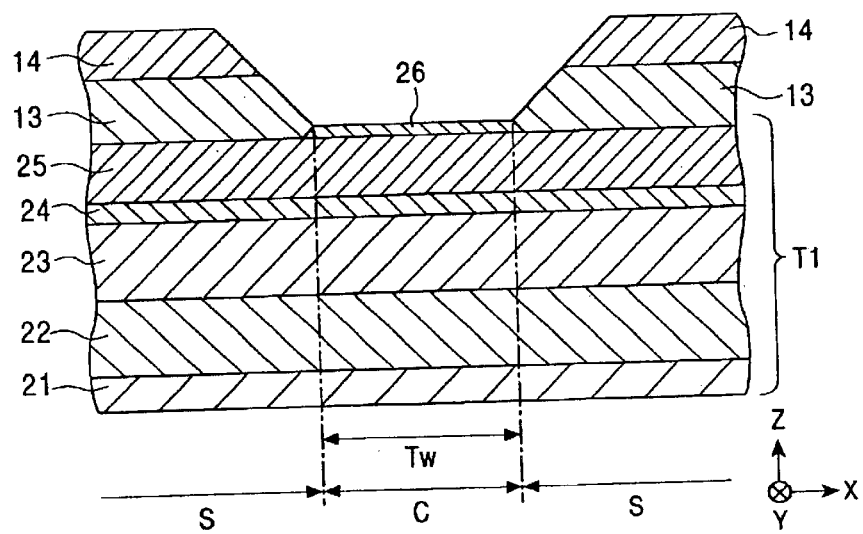
FIG. 2 is an enlarged partial cross-sectional view of the laminate T1.

FIG. 2 is an enlarged partial cross-sectional view of the laminate T1, the second antiferromagnetic layers 13, and the electrode layers 14 around the track width region C.

As shown in FIG. 2, the laminate T1 is constituted from a base layer 21, a first antiferromagnetic layer 22, a pinned magnetic layer 23, a nonmagnetic material layer 24, and a free magnetic layer 25, stacked in that order. The second antiferromagnetic layers 13 the track-width-Tw away from each other are disposed on the free magnetic layer 25. The electrode layers 14 are disposed on the second antiferromagnetic layers 13. A nonmagnetic protective layer 26 composed of tantalum of the like is formed on the free magnetic layer 25 between the second antiferromagnetic layers 13.

The base layer 21 is preferably composed of at least one element selected from Ta, Hf, Nb, Zr, Ti, Mo, and W. The thickness of the base layer 21 is approximately 50 Å or less. Alternatively, the base layer 21 may not be formed.

The first antiferromagnetic layer 22 and the second antiferromagnetic layers 13 are composed of a PtMn alloy, an X—Mn alloy wherein X is at least one of Pd, Ir, Rh, Ru, Os, Ni and Fe, or a Pt—Mn—X' alloy wherein X' is at least one of Pd, Ir, Rh, Ru, Au, Ag, Os, Cr, Ni, Ar, Ne, Xe, and Kr.

These alloys immediately after deposition have a disordered face-centered cubic (fcc) structure; however, the alloys transform to an ordered CuAuI face-centered tetragonal (fct) structure by heating.

The thickness of the first antiferromagnetic layer 22 is 80 to 300 Å, for example, 200 Å. The thickness of the second antiferromagnetic layers 13 is 80 to 500 Å. The second antiferromagnetic layers 13 cannot produce an exchange anisotropic magnetic field of a desired intensity between the second antiferromagnetic layers 13 and the free magnetic layer 25 at a thickness of less than 80 Å. The electrical resistance becomes excessively large when the thickness of the second antiferromagnetic layers 13 exceeds 500 Å.

The PtMn alloy and the X—Mn alloy for forming the first antiferromagnetic layer 22 and the second antiferromagnetic layers 13 preferably contain 37 to 63 atom %, and more preferably 47 to 57 atom % of Pt or X.

The X'+Pt content in the Pt—Mn—X'alloy is preferably 37 to 63 atom %, and more preferably 47 to 57 atom %. The X' content is preferably 0.2 to 10 atom %. When X' is at least one selected from Pd, Ir, Rh, Ru, Os, Ni, and Fe, the X' content is preferably 0.2 to 40 atom %.

The first antiferromagnetic layer 22 and the second antiferromagnetic layers 13 composed of these alloys can generate a large exchange coupling magnetic field when annealed. Particularly, when the PtMn alloy is used, an exchange coupling magnetic field of 48 kA/m or more, for example, exceeding 64 kA/m, can be generated, and the blocking temperature of the first antiferromagnetic layer 22 and the second antiferromagnetic layers 13 can be increased to 380° C. The blocking temperature is the temperature at which an exchange coupling magnetic field is lost.

The pinned magnetic layer 23 is composed of a ferromagnetic material such as a NiFe alloy, elemental cobalt, a CoFeNi alloy, a CoFe alloy, or a CoNi alloy. Preferably, the pinned magnetic layer 23 is composed of a CoFe alloy or elemental cobalt.

Alternatively, the pinned magnetic layer 23 may have a two-layer structure that includes a layer composed of one of the above-described materials and an anti-diffusion layer such as a cobalt layer.

The nonmagnetic material layer 24 prevents the pinned magnetic layer 23 from magnetically coupling with the free magnetic layer 25. Since a sensing current mainly flows in the nonmagnetic material layer 24, the nonmagnetic material layer 24 is preferably composed of a conductive nonmagnetic material such as Cu, Cr, Au, or Ag. Copper (Cu) is particularly preferred. The thickness of the nonmagnetic material layer 24 is 18 to 30 Å, for example.

The free magnetic layer 25 is composed of a ferromagnetic material such as a NiFe alloy, elemental Co, a CoFeNi alloy, a CoFe alloy, or a CoNi alloy. Preferably, the free magnetic layer 25 is composed of a NiFe alloy, a CoFe alloy, or a CoFeNi alloy.

Preferably, the free magnetic layer 25 has a two-layer structure that includes a Co layer or a CoFe alloy layer in contact with the nonmagnetic material layer 24. In this manner, the diffusion of metal elements or the like at the interface with the nonmagnetic material layer 24 can be prevented, and the rate of change in resistance ($\Delta R/R$) can be increased.

The electrode layers 14 are composed of a material having a resistivity smaller than the antiferromagnetic material that constitutes the second antiferromagnetic layers 13. Examples of the material of the electrode layers 14 include W, Ta, Cr, Cu, Rh, Ir, Ru, and Au.

The magnetic sensing element in FIG. 2 is a spin-valve magnetic sensing element of a bottom type. The exchange anisotropic magnetic field generated between the first antiferromagnetic layer 22 and the pinned magnetic layer 23 pins the magnetization direction of the pinned magnetic layer 23 in the Y direction in the drawing. The exchange anisotropic magnetic field generated between the second antiferromagnetic layers 13 and the free magnetic layer 25 orients the magnetization direction of the free magnetic layer 25 in the X direction in the drawing. In other words, the magnetization direction of the pinned magnetic layer 23 is perpendicular to that of the free magnetic layer 25 when a sensing current is supplied.

An external magnetic field, i.e., a leakage magnetic field from a recording medium, is applied to the magnetic sensing element in the Y direction in the drawing. In response to application of the external magnetic field, the magnetization direction of the free magnetic layer 25 shifts with high sensitivity. This shift in magnetization direction relative to the pinned magnetization direction of the pinned magnetic layer 23 changes the electrical resistance, resulting in a change in voltage. The external magnetic field is detected based on this voltage change.

Note that the recording medium moves in the Z direction in the drawing.

The lower gap layer 12, the base layer 21, the first antiferromagnetic layer 22, the pinned magnetic layer 23, the nonmagnetic material layer 24, the free magnetic layer 25, the second antiferromagnetic layers 13, the electrode layers 14, the insulating layer 15, and the upper gap layer 16 are formed by a thin-film formation process such as sputtering or vapor deposition.

Figure 3:
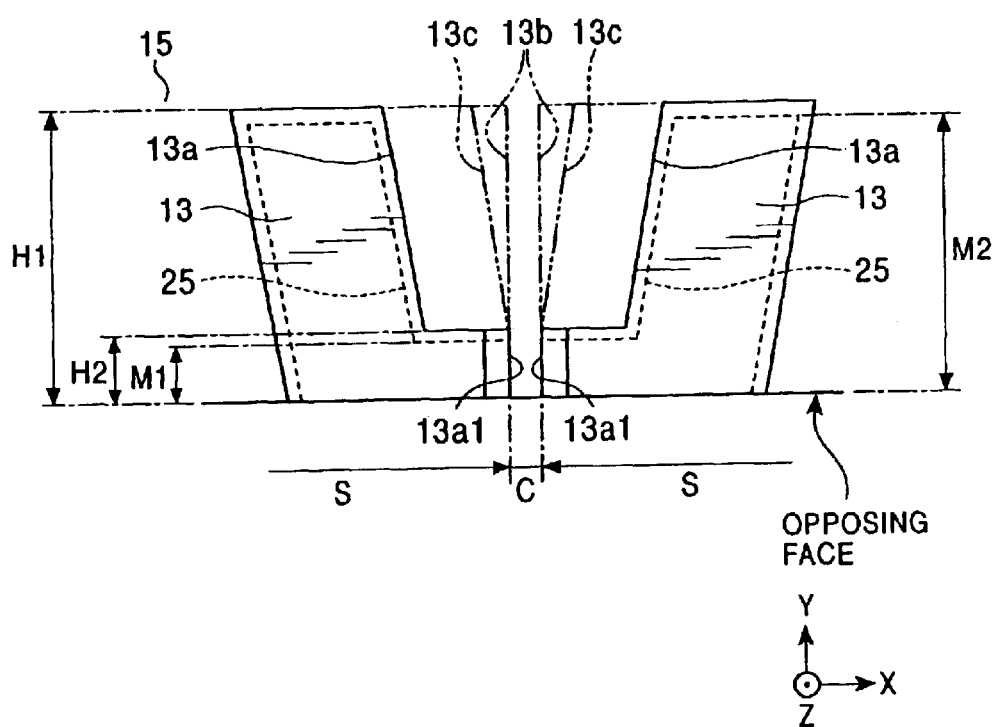
FIG. 3 is a partial plan view the magnetic sensing element shown in FIG. 1.

FIG. 3 is a plan view the magnetic sensing element shown in FIG. 1 without the upper shield layer 17, the upper gap layer 16, and the electrode layers 14 viewed from above.

As shown in FIG. 3, the length H1 of the second antiferromagnetic layers 13 in the height direction, i.e., the Y direction in the drawing, is larger than the length M1 of the free magnetic layer 25 in the track width region C. Such a structure decreases the electrical resistance in a direction parallel to the surfaces of the second antiferromagnetic layers 13. The phrase "the length H1 of the second antiferromagnetic layers 13 in the height direction" refers to the length of the second antiferromagnetic layer 13 in the height direction in the side regions S.

Moreover, the area of the surfaces of the second antiferromagnetic layers 13 increases, thereby improving heat-releasing property.

Accordingly, when the magnetic sensing element comes into contact with a charged object or when a transient current flows during switching, the amount of heat generated at the junctions between the second antiferromagnetic layers 13 and the free magnetic layer 25 can be reduced. Furthermore, the intensity and the magnetization direction of the exchange anisotropic magnetic field generated between the second antiferromagnetic layers 13 and the free magnetic layer 25 can be prevented from changing. Thus, the resistance to soft ESD can be enhanced, and degradation in the output symmetry and a decrease in output can be avoided.

As the length of the second antiferromagnetic layer 13 in the height direction increases, the volume of the second antiferromagnetic layers 13 also increases. Thus, when the free magnetic layer 25 is formed at small dimensions, for example, a length M1 in the height direction in the track width region C of 0.2 μm or less, segmentation of the crystal grains in the second antiferromagnetic layers 13 can be avoided. Accordingly, the anisotropic energy of the second antiferromagnetic layers 13 and the exchange anisotropic magnetic field between the second antiferromagnetic layers 13 and the free magnetic layer 25 can be increased.

Moreover, the blocking temperature can be increased, and the intensity and the direction of the exchange anisotropic magnetic field between the second antiferromagnetic layers 13 and the free magnetic layer 25 due to generation of heat can be prevented from changing.

The length M2 of the free magnetic layer 25 in the height direction in the side regions S is larger than the length M1 of the free magnetic layer 25 in the height direction in the track width region C. The phrase "length M2 of the free magnetic layer 25 in the height direction in the side regions S" refers to the maximum length of the free magnetic layer 25 in the height direction in the side regions S.

This structure increases the area of the junctions between the second antiferromagnetic layers 13 and the free magnetic layer 25, thereby increasing the intensity of the exchange anisotropic magnetic field between the second antiferromagnetic layers 13 and the free magnetic layer 25.

As the junction area between the second antiferromagnetic layers 13 and the free magnetic layer 25 increases, the electrical resistance in the planar direction at the portions where the second antiferromagnetic layers 13 overlap the free magnetic layer 25 decreases. Thus, when a transient current flows in the magnetic sensing element, the amount of heat generated at the junctions between the second antiferromagnetic layers 13 and the free magnetic layer 25 can be minimized. Moreover, the intensity and the direction of the exchange anisotropic magnetic field between the second antiferromagnetic layers 13 and the free magnetic layer 25 can be prevented from changing. In other words, degradation in output symmetry and a decrease in output of the magnetic sensing element can be effectively avoided.

Furthermore, since the area of the free magnetic layer 25 as well as that of the second antiferromagnetic layers 13 is increased, the heat releasing property of the free magnetic layer 25 is also enhanced.

According to this structure, the density of the sensing current at the regions where the second antiferromagnetic layers 13 overlap the free magnetic layer 25 is small. Thus, the intensity of the magnetic field generated by the sensing current is also small. Thus, the intensity and the direction of the exchange anisotropic magnetic field between the second antiferromagnetic layers 13 and the free magnetic layer 25 can be prevented from changing.

In the sensing current that flows in the magnetic sensing element, the current that flows in the region sandwiched by inner end faces 13a of the second antiferromagnetic layers 13 directly contributes to the detection of the magnetic field. The current diverging from the junctions between the second antiferromagnetic layers 13 and the free magnetic layer 25 to the side regions of the laminate T1 is preferably small.

The structure of the present invention decreases the amount of the current diverging to the side regions of the laminate T1, thereby avoiding a phenomenon called side reading. Side reading is detection of an external magnetic field, i.e., a leakage magnetic field from a recording medium, at the side regions S outside the track width region C of the magnetic sensing element.

Figure 4:
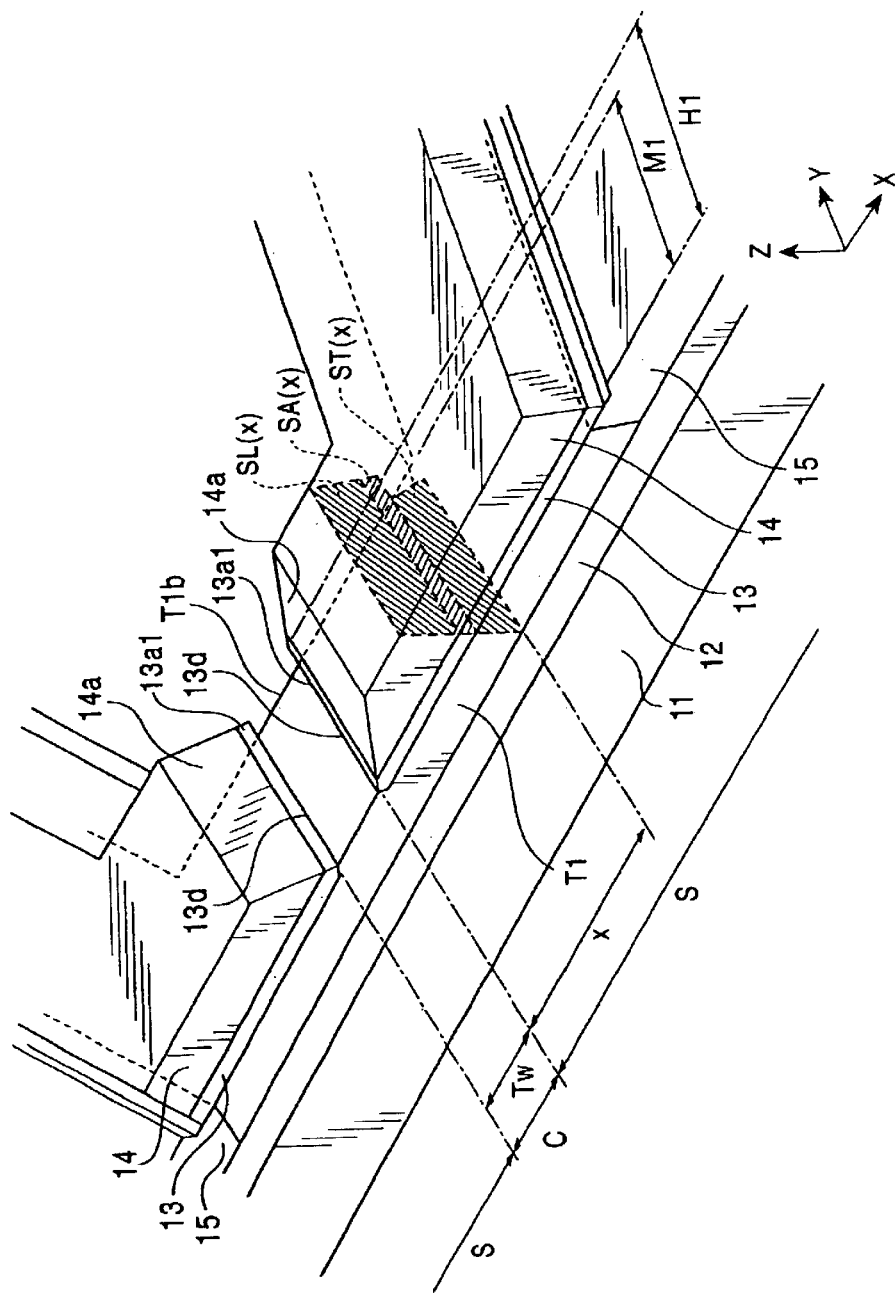
FIG. 4 is a perspective view of the magnetic sensing element shown in FIG. 1.

FIG. 4 is a perspective view of the magnetic sensing element shown in FIG. 1 without the upper shield layer 17, the upper gap layer 16, and the electrode layers 14.

Referring to FIGS. 3 and 4, the magnetic sensing element has the inner end faces 13a of the second antiferromagnetic layers 13 that oppose each other with a gap corresponding to the track width Tw therebetween. Part of each inner end face 13a near the opposing face constitutes a slope 13a1 having a length H1 in the height direction. The length H1 is larger than the length M1 of the free magnetic layer 25 in the height direction in the track width region C. Alternatively, each inner end face 13a may be a flat face perpendicular to the surface of the free magnetic layer 25 or may be a curved face.

The electrode layers 14 have slopes 14a, which are continuous with the slopes 13a1 of the second antiferromagnetic layer 13. The slopes 13a1 and 14a extend beyond a rear edge T1b of the laminate T1 in the Y direction.

Preferably, the length H1 of the slopes 13a1 in the height direction is 1 μm or more, and more preferably 1.5 μm or more. The length M1 of the free magnetic layer 25 in the height direction in the track width region C is, for example, 0.2 μm.

When H1≧1 μm, the change in asymmetry of the magnetic sensing element can be reduced to 10% or less in a soft ESD resistance test using a human body model with an applied voltage of 20 V or less, as described below.

The term "asymmetry" refers to a degree of asymmetry of the reproduced output waveform. Asymmetry becomes smaller as the reproduced output waveform becomes more symmetrical. The closer the asymmetry is to 0%, the superior the symmetry of the reproduced output waveform.

Asymmetry is zero when no external magnetic field is applied and when the magnetization direction of the free magnetic layer 25 is perpendicular to that of the pinned magnetic layer 23. The information on a medium cannot be reproduced accurately at a large asymmetry, resulting in an error. The smaller the asymmetry, the higher the reliability of signal processing. A spin-valve thin film magnetic element with a small asymmetry has superior performance.

Preferably, the length H1 of the slopes 13a1 of the second antiferromagnetic layers 13 is 10 μm or less. At a length H1 exceeding 10 μm, short-circuiting between the second antiferromagnetic layers 13 and the upper shield layer 17 may readily occur.

The second antiferromagnetic layers 13 completely cover the free magnetic layer 25 in the side regions S outside the track width region C. This structure maximize the exchange anisotropic magnetic field between the second antiferromagnetic layers 13 and the free magnetic layer 25 and prevents the intensity and direction of the exchange anisotropic magnetic field between the second antiferromagnetic layers 13 and the free magnetic layer 25 from changing.

The electrode layers 14 completely cover the top surfaces of the second antiferromagnetic layers 13 to reduce the electrical resistance.

In this embodiment, each second antiferromagnetic layer 13 has a portion extending in the track width direction and a portion extending diagonally in the height direction, i.e., the letter-L shape. The free magnetic layer 25 also has a shape corresponding to this shape.

Alternatively, the second antiferromagnetic layers 13 may have slopes 13b that extend over the entire length of the second antiferromagnetic layers 13 in the height direction, i.e., the Y direction, as shown by double-dotted chain lines in FIG. 3. The distance between the slopes 13b opposing each other is the track width Tw and remains the same over the entire length in the height direction.

Alternatively, the second antiferromagnetic layers 13 may have slopes 13c that also extend over the entire length of the second antiferromagnetic layers 13 in the height direction, i.e., the Y direction, as shown by long-dashed double-short-dashed lines in FIG. 3. At the region near the opposing face, the distance between the opposing slopes 13c is the track width Tw. In the remaining regions, the distance between the slopes 13c gradually increases toward rear ends of the second antiferromagnetic layers 13.

Referring to FIG. 4, for each of the electrode layers 14, the second antiferromagnetic layers 13, and the laminate T1, a cross-section perpendicular to the track width direction is taken at a position a distance x away from each edge 13d of the second antiferromagnetic layer 13. The area of the cross-section of the electrode layer 14 is denoted as "SL(x)", the area of the cross-section of the second antiferromagnetic layer 13 is denoted as "SA(x)", and the area of the cross-section of the laminate T1 is denoted as "ST(x)".

The average cross-sectional area SL of the electrode layers 14 within 0.2 μm from the edge 13d preferably satisfies the relationship SL≧0.015 μm²; the average cross-sectional area SA of the second antiferromagnetic layers 13 within 0.2 μm from the edge 13d preferably satisfies the relationship SA≧0.015 μm²; and the average cross-sectional area ST of the laminate T1 within 0.2 μm from the edge 13d preferably satisfies the relationship ST≧0.025 μm². In this manner, the resistance can be reduced to a proper value.

The average SL is calculated as follows: (volume of the electrode layer 14 within 0.2 μm in the track width direction from the edge 13d, i.e., Σ(SL(x)·Δx) wherein 0≦x≦0.2 and Δx→0)/0.2. The average SA is calculated as follows: (volume of the second antiferromagnetic layer 13 within 0.2 μm in the track width direction from the edge 13d, i.e., Σ(SA(x)·Δx) wherein 0≦x≦0.2 and Δx→0)/0.2. The average ST is calculated as follows: (volume of the laminate T1 within 0.2 μm in the track width direction from the edge 13d, i.e., Σ(SL(x)·Δx) wherein 0≦x≦0.2 and Δx→0)/0.2.

Second Embodiment

Figure 5:
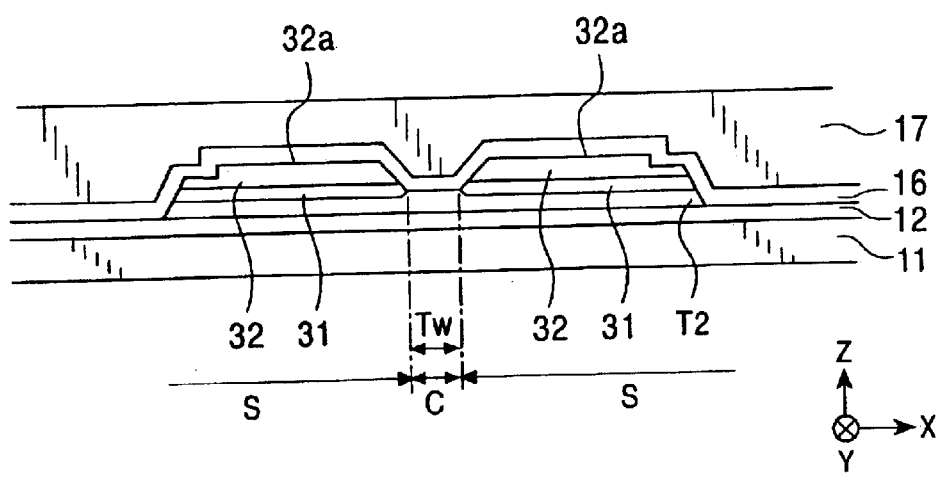
FIG. 5 is a partial front view of a magnetic sensing element according to a second embodiment of the present invention when viewed from a face that opposes a recording medium.

FIG. 5 is a partial front view of a magnetic sensing element according to a second embodiment of the present invention when viewed from a face that opposes a recording medium (hereinafter, the opposing face).

As in the magnetic sensing element of the first embodiment shown in FIG. 1, the magnetic sensing element shown in FIG. 5 includes a lower shield layer 11 formed on a base layer (not shown), which is formed on a substrate (also not shown) and composed of an insulating material such as alumina. A lower gap layer 12 is formed on the lower shield layer 11, and a laminate T2 is disposed on the lower gap layer 12. The laminate T2 is formed by stacking a first antiferromagnetic layer, a pinned magnetic layer, a nonmagnetic material layer, and a free magnetic layer.

A pair of second antiferromagnetic layers 31 is formed on a top face T2a of the laminate T2, i.e., on the free magnetic layer. The second antiferromagnetic layers 31 are separated from each other in the track width direction, i.e., the X direction, by a gap therebetween. The length of the gap corresponds to the track width Tw. Electrode layers 32 are stacked on the second antiferromagnetic layers 31. The second antiferromagnetic layers 31 are composed of the same material as the second antiferromagnetic layers 13, and the electrode layers 32 are composed of the same material as the electrode layers 14.

An upper gap layer 16 is formed over a track width region C of the laminate T2, the electrode layers 32, and the lower gap layer 12. A upper shield layer 17 is formed on the upper gap layer 16.

The track width region C is the region of the laminate T2 sandwiched by the second antiferromagnetic layers 31. Two side regions S are disposed at the lateral sides of the track width region C.

The layer structure of the laminate T2 is same as that of the laminate T1. That is, the laminate T2 includes a base layer, a first antiferromagnetic layer, a pinned magnetic layer, a nonmagnetic material layer, and a free magnetic layer, stacked in that order.

Figure 6:
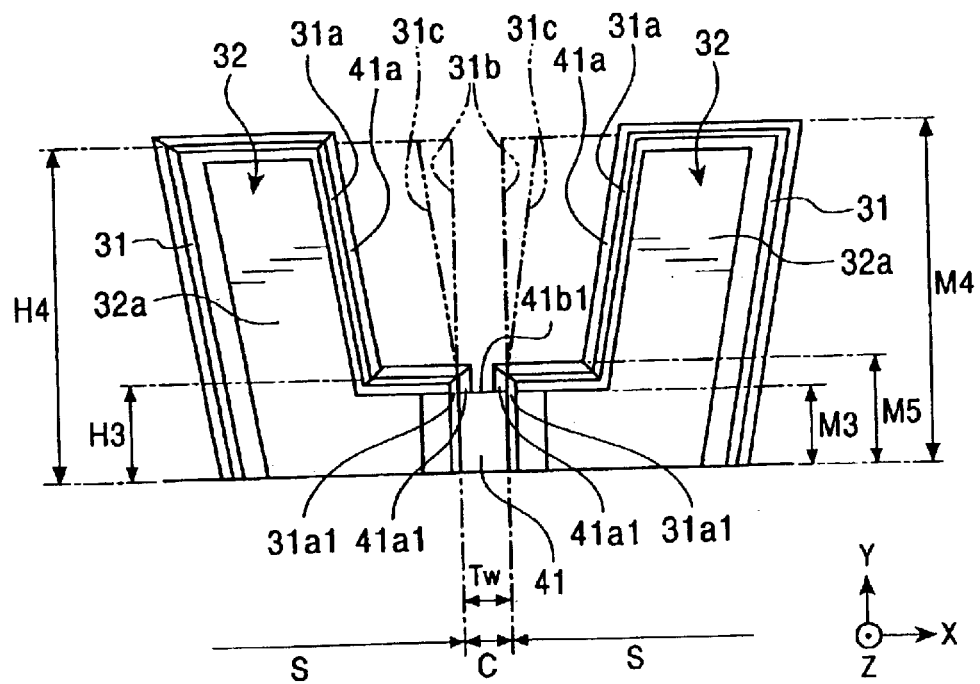
FIG. 6 is a partial plan view of the magnetic sensing element shown in FIG. 5.
Figure 7:
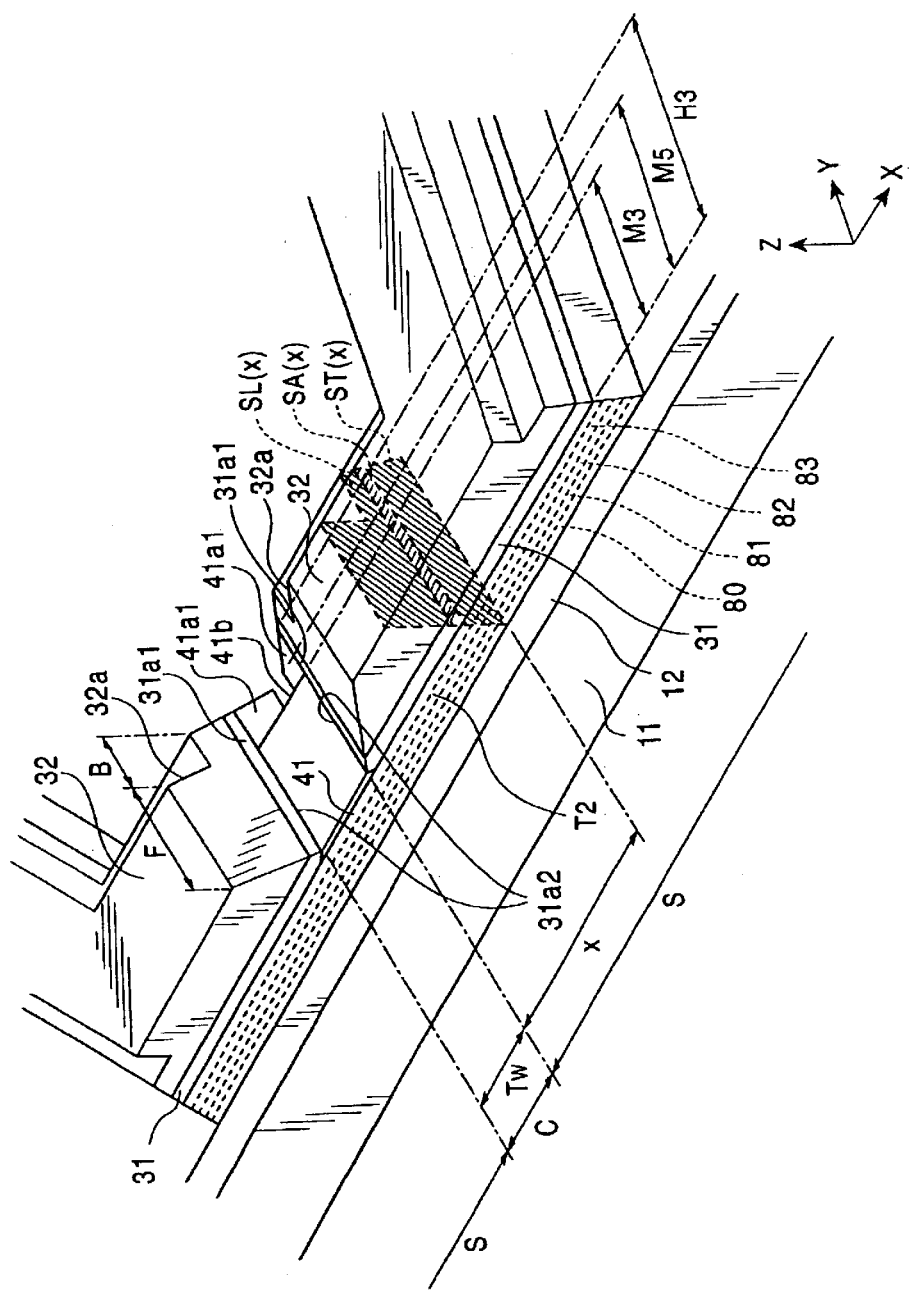
FIG. 7 is a perspective view of the magnetic sensing element shown in FIG. 5.

FIG. 6 is a plan view of the magnetic sensing element shown in FIG. 5 without the upper shield layer 17, the upper gap layer 16, and the electrode layers 32 viewed from above. FIG. 7 is a perspective view of the magnetic sensing element shown in FIG. 5 without the upper shield layer 17 and the upper gap layer 16.

As shown in FIG. 6, a length H3 of the second antiferromagnetic layers 31 in the height direction, i.e., the Y direction in the drawing, is larger than a length M3 of a free magnetic layer 41 in the height direction within the track width region C. The free magnetic layer 41 is the topmost layer of the laminate T2. This structure reduces the electrical resistance in a direction parallel to the surface of the second antiferromagnetic layers 31. Note that the length H3 of the second antiferromagnetic layer 31 in the height direction refers to the length of the second antiferromagnetic layers 31 in the height direction at the side regions S disposed at the lateral sides of the track width region C.

Since the area of the surfaces of the second antiferromagnetic layers 31 increases, the heat-releasing property can be improved.

Accordingly, when the magnetic sensing element comes into contact with a charged object or when a transient current flows during switching, the amount of heat generated at the junctions between the second antiferromagnetic layers 31 and the free magnetic layer 41 can be reduced. Furthermore, the intensity and the magnetization direction of the exchange anisotropic magnetic field generated between the second antiferromagnetic layers 31 and the free magnetic layer 41 can be prevented from changing. Thus, the resistance to soft ESD can be enhanced, and degradation in output symmetry and a decrease in output can be prevented.

As the length of the second antiferromagnetic layers 31 in the height direction increases, the volume of the second antiferromagnetic layers 31 also increases. Thus, when the free magnetic layer 41 is formed to have small dimensions, for example, a length M3 in the height direction in the track width region C of 0.2 μm or less, segmentation of the crystal grains in the second antiferromagnetic layers 31 can be avoided. Accordingly, the anisotropic energy of the second antiferromagnetic layers 31 and the exchange anisotropic magnetic field between the second antiferromagnetic layers 31 and the free magnetic layer 41 can be increased.

Moreover, the blocking temperature at which the exchange anisotropic magnetic field between the second antiferromagnetic layers 31 and the free magnetic layer 41 is lost can be increased, and the intensity and the direction of the exchange anisotropic magnetic field between the second antiferromagnetic layers 31 and the free magnetic layer 41 due to generation of heat can be prevented from changing.

A length M4 and a length M5 of the free magnetic layer 41 in the height direction in the side regions S are larger than the length M3 of the free magnetic layer 41 in the height direction in the track width region C. The length M4 refers to the maximum length of the second antiferromagnetic layers 31 in the height direction in the side regions S. The length M5 is the length of the second antiferromagnetic layers 31 near the track width region C in the side regions S.

This structure increases the junction area between the second antiferromagnetic layers 31 and the free magnetic layer 41, thereby increasing the intensity of the exchange anisotropic magnetic field between the second antiferromagnetic layers 31 and the free magnetic layer 41.

As the junction area between the second antiferromagnetic layers 31 and the free magnetic layer 41 increases, the electrical resistance in the planar direction at the portions where the second antiferromagnetic layers 31 overlap the free magnetic layer 41 decreases. Thus, when a transient current flows in the magnetic sensing element, the amount of heat generated at the junctions between the second antiferromagnetic layers 31 and the free magnetic layer 41 can be minimized. Moreover, the intensity and the direction of the exchange anisotropic magnetic field between the second antiferromagnetic layers 31 and the free magnetic layer 41 can be prevented from changing. In other words, degradation in output symmetry and a decrease in output of the magnetic sensing element can be effectively avoided.

Furthermore, since the area of the free magnetic layer 41 as well as that of the second antiferromagnetic layers 31 is increased, the heat releasing property of the free magnetic layer 41 is also enhanced.

According to this structure, the density of the sensing current at the regions where the second antiferromagnetic layers 31 overlap the free magnetic layer 41 is small. Thus, the intensity of the magnetic field generated by the sensing current is also small. Thus, the intensity and the direction of the exchange anisotropic magnetic field between the second antiferromagnetic layers 31 and the free magnetic layer 41 can be prevented from changing.

As shown in FIGS. 6 and 7, the second antiferromagnetic layers 31 of the magnetic sensing element of this embodiment have inner end faces 31a that oppose each other. The portion of each inner end face 31a extending from the opposing face in the height direction, i.e., the Y direction perpendicular to the track width direction, constitutes a slope 31a1. The slopes 31a1 oppose each other with a gap corresponding to the track width Tw therebetween. The length H3 of the slope 31a1 in the height direction is larger than the length M3 of the free magnetic layer 41 in the height direction within the track width region C. The slopes 31a1 may be a flat surface perpendicular to the surface of the free magnetic layer 41 or may be curved.

Because the slope 31a1 extend in the height direction, the cross-sectional area of the second antiferromagnetic layers 31 perpendicular to the surface can be efficiently increased.

Referring again to FIGS. 6 and 7, the free magnetic layer 41 disposed under the second antiferromagnetic layers 31 has inner end faces 41a. A portion of each inner end face 41a extending in the height direction, i.e., the Y direction perpendicular to the track width direction, constitutes a slope 41a1. The length M5 of the slopes 41a1 in the height direction is larger than the length M3 of the free magnetic layer 41 in the height direction within the track width region C. The slopes 41a1 may be a flat plane perpendicular to the surface of the free magnetic layer 41 or may be curved.

In this embodiment, the length H3 of the slopes 31a1 in the height direction and the length M5 of the slopes 41a1 in the height direction are preferably 1 μm or more, and more preferably 1.5 μm or more. The length M3 of the free magnetic layer 41 in the height direction in the track width region C is, for example, 0.2 μm.

When the length of the slopes 31a1 and 41a1 in the height direction is 1 μm or more, the change in asymmetry of the magnetic sensing element can be reduced to 10% or less in a soft ESD resistance test using a human body model with an applied voltage of 20 V or less, as described below.

Preferably, the length of the slopes 31a1 and 41a1 in the height direction is 10 μm or less. At a length exceeding 10 μm, short-circuiting between the upper shield layer 17 and the second antiferromagnetic layer 31 or between the upper shield layer 17 and the free magnetic layer 41 may readily occur.

When the magnetic sensing element shown in FIGS. 5 to 7 is produced by a method described below, step differences 32a are formed in the electrode layer 32. Thus, as shown in FIG. 7, the thickness of the electrode layers 32 is larger in a region F from the opposing face up to a rear end face 41b than in a region B behind the rear end face 41b in the Y direction.

The second antiferromagnetic layers 31 completely cover the free magnetic layer 41 at the side regions S. This structure maximizes the intensity of the exchange anisotropic magnetic field between the free magnetic layer 41 and the second antiferromagnetic layers 31 and prevents the intensity and the magnetization direction of the anisotropic magnetic field between the second antiferromagnetic layers 31 and the free magnetic layer 41 from changing.

The electrode layers 32 completely cover the top faces of the second antiferromagnetic layers 31 so as to reduce the electrical resistance.

In the sensing current that flows in the magnetic sensing element, the current that flows in the region sandwiched by inner end faces 31*a* of the second antiferromagnetic layers 31 directly contributes to the detection of the magnetic field. The current diverging from the junctions between the second antiferromagnetic layers 31 and the free magnetic layer 41 to the side regions of the laminate T2 is preferably small.

The structure of the present invention decreases the amount of the current diverging to the side regions of the laminate T2, thereby avoiding a phenomenon called side reading. Side reading is detection of an external magnetic field, i.e., a leakage magnetic field from a recording medium, at the side regions S outside the track width region C of the magnetic sensing element.

In this embodiment, each of the second antiferromagnetic layers 31 has a portion extending in the track width direction and the remainder extending in a direction diagonal to the height direction. In other words, the second antiferromagnetic layers 31 have a bent shape. The free magnetic layer 41 also has a corresponding bent shape.

Alternatively, as shown in FIG. 6, the second antiferromagnetic layers 31 may have opposing slopes 31*b* extending over the entire length in the height direction (the Y direction perpendicular to the track width direction) and maintaining the gap corresponding the track width Tw therebetween.

Alternatively, as shown in FIG. 6, the second antiferromagnetic layers 31 may have opposing slopes 31*c* including portions that oppose each other with a gap corresponding to the track width Tw therebetween and the remainders separated from each other with a gap that gradually increases along the Y direction.

Although not shown in the drawing, the free magnetic layer 41 may have inner end faces constituted from slopes extending over the entire length in the height direction, the slopes opposing each other with a gap corresponding the track width Tw therebetween. Alternatively, the free magnetic layer 41 may have inner end faces constituted from slopes that include portions that oppose each other with a gap corresponding to the track width Tw therebetween and the remainders separated from each other with a gap that gradually increases along the Y direction.

Referring to FIG. 7, for each of the electrode layers 32, the second antiferromagnetic layers 31, and the laminate T2, a cross-section perpendicular to the track width direction is taken at a position a distance x away from each edge 31*a*2 of the second antiferromagnetic layer 31. The area of the cross-section of the electrode layer 32 is denoted as "SL(x)", the area of the cross-section of the second antiferromagnetic layer 31 is denoted as "SA(x)", and the area of the cross-section of the laminate T2 is denoted as "ST(x)".

The average cross-sectional area SL of the electrode layers 32 within 0.2 $\mu$m from the edge 31*a*2 preferably satisfies the relationship SL≧0.015 $\mu$m$^2$; the average cross-sectional area SA of the second antiferromagnetic layers 31 within 0.2 $\mu$m from the edge 31*a*2 preferably satisfies the relationship SA≧0.015 $\mu$m$^2$; and the average cross-sectional area ST of the laminate T2 within 0.2 $\mu$m from the edge 31*a*2 preferably satisfies the relationship ST≧0.025 $\mu$m$^2$. In this manner, the resistance can be reduced to a proper value.

The average SL is calculated as follows: (volume of the electrode layer 32 within 0.2 $\mu$m in the track width direction from the edge 31*a*2, i.e., $\Sigma(SL(x)\cdot\Delta x)$ wherein $0\leq x\leq 0.2$ and $\Delta x \to 0)/0.2$. The average SA is calculated as follows: (volume of the second antiferromagnetic layer 31 within 0.2 $\mu$m in the track width direction from the edge 31*a*2, i.e., $\Sigma(SA(x)\cdot\Delta x)$ wherein $0\leq x\leq 0.2$ and $\Delta x \to 0)/0.2$. The average ST is calculated as follows: (volume of the laminate T2 within 0.2 $\mu$m in the track width direction from the edge 31*a*2, i.e., $\Sigma(SL(x)\cdot\Delta x)$ wherein $0\leq x\leq 0.2$ and $\Delta x \to 0)/0.2$.

Third Embodiment

Figure 8:
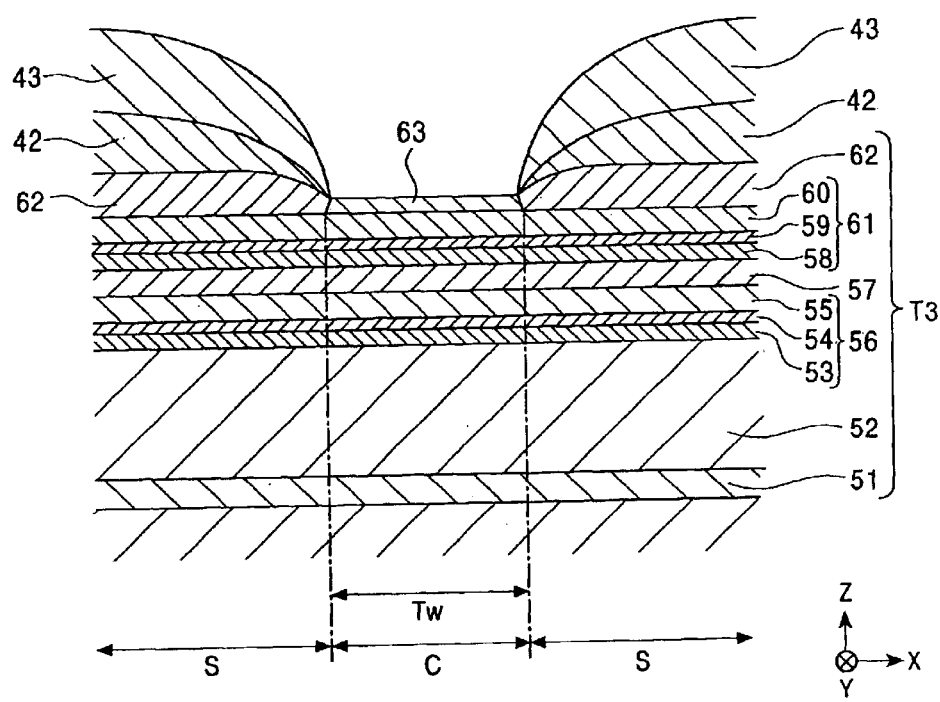
FIG. 8 is a partial enlarged view of a magnetic sensing element of a third embodiment including a laminate T3.

FIG. 8 is a partial enlarged view of a magnetic sensing element according to a third embodiment of the present invention showing a laminate T3, second antiferromagnetic layers 42, and electrode layers 43 near a track width region C.

Referring to FIG. 8, the laminate T3 is constituted from a base layer 51; a first antiferromagnetic layer 52; a pinned magnetic layer 56 of a synthetic ferri-pinned type constituted from a first pinned magnetic sublayer 53, a nonmagnetic interlayer 54, and a second pinned magnetic sublayer 55; a nonmagnetic material layer 57; a free magnetic layer 61 of a synthetic ferri-pinned type constituted from a second free magnetic sublayer 58, a nonmagnetic interlayer 59, and a first free magnetic sublayer 60; a pair of ferromagnetic layers 62 opposing each other with a gap corresponding to the track width therebetween, the ferromagnetic layers 62 being disposed on the first free magnetic sublayer 60; and a protective layer 63.

The base layer 51, the nonmagnetic material layer 57, the second antiferromagnetic layers 42, and the electrode layers 43 are composed of the same material as the base layer 21, the nonmagnetic material layer 24, the second antiferromagnetic layers 13, and the electrode layers 14 shown in FIG. 2, respectively.

The first pinned magnetic sublayer 53 and the second pinned magnetic sublayer 55 of the laminate T3 are composed of a ferromagnetic material. Examples of the ferromagnetic material include a NiFe alloy, elemental Co, a CoFeNi alloy, a CoFe alloy, and a CoNi alloy. A CoFe alloy or elemental Co is particularly preferred. The first pinned magnetic sublayer 53 and the second pinned magnetic sublayer 55 are preferably made of the same material.

The nonmagnetic interlayer 54 is composed of a nonmagnetic material containing at least one of Ru, Rh, Ir, Cr, Re, and Cu. Preferably, the nonmagnetic interlayer 54 is composed of Ru.

The thickness of the first pinned magnetic sublayer 53 and the second pinned magnetic sublayer 55 is approximately 10 to 70 Å, respectively. The thickness of the nonmagnetic interlayer 54 is approximately 3 to 10 Å.

Alternatively, the pinned magnetic layer 56 may be constituted from two sublayers, one being a layer composed of a magnetic material described above and the other being an anti-diffusion layer composed of elemental Co or the like.

The first free magnetic sublayer 60 and the second free magnetic sublayer 58 are composed of a ferromagnetic material. Examples of the ferromagnetic material include a NiFe alloy, elemental Co, a CoFeNi alloy, a CoFe alloy, and a CoNi alloy. A NiFe alloy, a CoFe alloy, or a CoFeNi alloy is particularly preferred.

The nonmagnetic interlayer 59 is composed of a nonmagnetic material containing at least one of Ru, Rh, Ir, Cr, Re, and Cu. Preferably, the nonmagnetic interlayer 59 is composed of Ru.

The thickness of the first free magnetic sublayer 60 and the second free magnetic sublayer 58 is approximately 10 to 70 Å, respectively. The thickness of the nonmagnetic interlayer 59 is approximately 3 to 10 Å.

The second free magnetic sublayer 58 preferably has a two-layer structure including a Co layer in contact with the nonmagnetic material layer 57. In this manner, diffusion of the metal elements or the like at the interface with the nonmagnetic material layer 57 can be prevented, and the rate of change in resistance (ΔR/R) can be increased.

The ferromagnetic layer 62 is composed of, for example, a CoFe alloy, a CoFeNi alloy, a CoFeX alloy, or a CoFeNiX alloy, wherein X is at least one element selected from the group consisting of Cr, Ti, V, Zr, Nb, Mo, Hf, Ta, and W.

The protective layer 63 contains at least one element selected from Ta, Hf, Nb, Zr, Ti, Mo, and W. The thickness of the protective layer 63 is approximately 30 Å.

In this embodiment, at least one of the first free magnetic sublayer 60 and the second free magnetic sublayer 58 is preferably composed of a magnetic material described below.

The magnetic material is preferably CoFeNi containing 9 to 17 atomic percent of Fe, 0.5 to 10 atomic percent of Ni, and the balance being Co.

Use of this material can increase the intensity of the exchange coupling magnetic field generated by the Ruderman-Kittel-Kasuya-Yosida (RKKY) interaction between the first free magnetic sublayer 60 and the second free magnetic sublayer 58. To be more specific, the spin-flop magnetic field (Hsf) can be increased to approximately 293 kA/m. The spin-flop magnetic field is the intensity of the magnetic field at which the antiparallel state collapses.

Accordingly, the magnetization direction of the first free magnetic sublayer 60 and that of the second free magnetic sublayer 58 can adequately enter an antiparallel state.

The first free magnetic sublayer 60 and the second free magnetic sublayer 58 are preferably composed of the CoFeNi alloy described above so as to stably achieve high spin-flop magnetic field and to put the magnetization directions of the first free magnetic sublayer 60 and the second free magnetic sublayer 58 in an antiparallel state.

Moreover, when the composition of the material of the first free magnetic sublayer 60 and the second free magnetic sublayer 58 satisfies the above-described ranges, the magnetostriction can be controlled within the range of $-3 \times 10^{-6}$ to $3 \times 10^{-6}$. Moreover, the coercive force can be reduced to 790 (A/m) or less.

Furthermore, the free magnetic layer has an enhanced soft magnetic property, and decreases in resistance change (ΔR) and rate of change in resistance (ΔR/R) due to diffusion of Ni between the free magnetic layer and the nonmagnetic material layer can be avoided.

When an anti-diffusion layer composed of Co or the like is formed between the second free magnetic sublayer 58 and the nonmagnetic material layer 57 and when at least one of the first free magnetic sublayer 60 and the second free magnetic sublayer 58 is composed of a CoFeNi alloy, the Fe content in the CoFeNi alloy is preferably in the range of 7 to 15 atomic percent, and the Ni content in the CoFeNi alloy is preferably in the range of 5 to 15 atomic percent, the balance being Co.

In the embodiment shown in FIG. 8, the first pinned magnetic sublayer 53, the nonmagnetic interlayer 54, and the second pinned magnetic sublayer 55, each having a different magnetic thickness, function as one pinned magnetic layer. Here, the magnetic thickness is the product of the saturation magnetization Ms and the thickness t (Ms×t).

The first pinned magnetic sublayer 53 is formed to be in contact with the first antiferromagnetic layer 52. The first pinned magnetic sublayer 53 is subjected to field annealing in order to generate an exchange anisotropic magnetic field by exchange coupling of the first pinned magnetic sublayer 53 and the first antiferromagnetic layer 52 at the interface. The generated exchange anisotropic magnetic field pins the magnetization direction of the first antiferromagnetic layer 52 in the Y direction in the drawing. When the magnetization direction of the first pinned magnetic sublayer 53 is pinned in the Y direction in the drawing, the magnetization direction of the second pinned magnetic sublayer 55, which opposes the first pinned magnetic sublayer 53 with the nonmagnetic interlayer 54 therebetween, is pinned antiparallel to the magnetization direction of the first pinned magnetic sublayer 53.

When the magnetization directions of the first pinned magnetic sublayer 53 and the second pinned magnetic sublayer 55 are antiparallel to each other, thereby being in a synthetic ferrimagnetic state, each of the first pinned magnetic sublayer 53 and the second pinned magnetic sublayer 55 pins the magnetization direction of the other. As a result, the magnetization direction of the pinned magnetic layer as a whole can be firmly pinned in a particular direction.

The magnetization direction of the pinned magnetic layer is the direction of the magnetic thickness (Ms×t) combining the magnetic thickness of the first pinned magnetic sublayer 53 and the magnetic thickness of the second pinned magnetic sublayer 55.

In the embodiment shown in FIG. 8, the first pinned magnetic sublayer 53 and the second pinned magnetic sublayer 55 are composed of the same material but have different thicknesses so that they have different magnetic thickness (Ms×t).

Since the static magnetic field of the first pinned magnetic sublayer 53 and the static magnetic field of the second pinned magnetic sublayer 55 cancel out each other, the demagnetizing field resulting from the pinned magnetization of the first pinned magnetic sublayer 53 and the second pinned magnetic sublayer 55 can be eliminated. Thus, the contribution of the demagnetizing field (dipolar magnetic field) to rotation of the magnetization direction of the free magnetic layer can be decreased.

Accordingly, the rotatable magnetization of the free magnetic layer can be easily corrected to a desired direction, and a spin-valve magnetic sensing element having a small asymmetry can be fabricated.

The term "asymmetry" refers to a degree of asymmetry of the reproduced output waveform. The asymmetry becomes smaller as the reproduced output waveform becomes more symmetrical. The closer the asymmetry is to 0%, the superior the symmetry of the reproduced output waveform.

The distribution of the demagnetizing field (dipolar magnetization field) resulting from the pinned magnetization of the pinned magnetic layer 56 is nonuniform. In particular, the demagnetizing field is large at the ends of the free magnetic layer 61 and is small at the center of the free magnetic layer 61 when viewed from the element height direction. Such nonuniformity obstructs the free magnetic layer 61 from entering a single magnetic domain state. However, when the pinned magnetic layer has the above-described three-layer structure, the dipole magnetization field can be reduced. Thus, no magnetic wall is formed in the free magnetic layer 61, nonuniformity in the magnetization can be avoided, and generation of Barkhausen noise can be avoided.

In this embodiment, the free magnetic layer 61 is constituted from the second free magnetic sublayer 58, the nonmagnetic interlayer 59, and the first free magnetic sublayer 60, and the second free magnetic sublayer 58 and the first free magnetic sublayer 60 having different magnetic thickness, i.e., Ms×t, are separated from each other by the nonmagnetic interlayer 59 therebetween. Thus, the magnetization direction of the second free magnetic sublayer 58 is antiparallel to that of the first free magnetic sublayer 60. In other words, the free magnetic layer 61 is in a synthetic ferrimagnetic state.

The magnetic sensing element shown in FIG. 8 includes a pair of ferromagnetic layers 62 disposed on the first free magnetic sublayer 60. The ferromagnetic layers 62 are separated from each other by a gap corresponding to the track width Tw therebetween. The second antiferromagnetic layers 42 and the electrode layers 43 are stacked on the ferromagnetic layer 62.

The ferromagnetic layers 62 are magnetized in the track width direction (the X direction) by the exchange anisotropic magnetic field generated between the second antiferromagnetic layers 42 and the ferromagnetic layers 62. The first free magnetic sublayer 60 is put to a single magnetic domain state and is magnetized in the track width direction as a result of ferromagnetic coupling between the ferromagnetic layers 62 and the first free magnetic sublayer 60. The magnetization direction of the second free magnetic sublayer 58 is 180° opposite to the magnetization direction of the first free magnetic sublayer 60. In other words, the magnetization direction of the second free magnetic sublayer 58 is antiparallel to the X direction in the drawing.

When the second free magnetic sublayer 58 and the first free magnetic sublayer 60 are antiparallel to each other, i.e., in a ferrimagnetic state, the same advantages as those obtained by reducing the thickness of the free magnetic layer can be achieved. As a result, the effective magnetic moment per unit area decreases, the magnetization direction of the free magnetic layer become readily rotatable, and the sensitivity of the magnetic sensing element can be enhanced.

The direction of the magnetic thickness (Ms×t) combining the magnetic thickness of the second free magnetic sublayer 58 and the magnetic thickness of the first free magnetic sublayer 60 is the magnetization direction of the free magnetic layer.

Note that only the magnetization direction of the second free magnetic sublayer 58 relative to the magnetization direction of the pinned magnetic layer 56 contributes to output.

Fourth Embodiment

Figure 9:
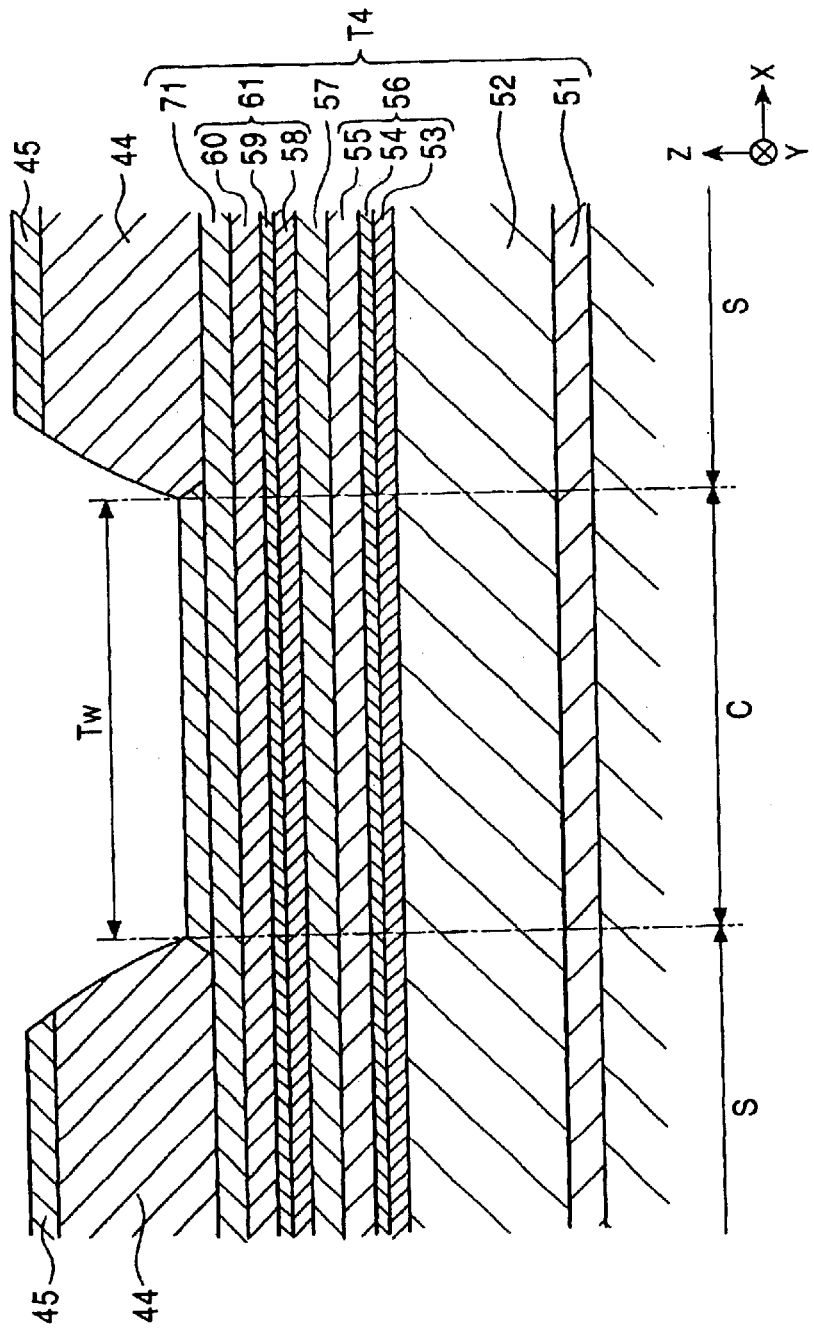
FIG. 9 is a partial enlarged view of a magnetic sensing element according to a fourth embodiment including a laminate T4.

FIG. 9 is a partial enlarged view of a magnetic sensing element according to a fourth embodiment including a laminate T4, second antiferromagnetic layers 44, and electrode layers 45 near the track width region C.

Referring to FIG. 9, the laminate T4 differs from the laminate T3 shown in FIG. 8 in that a nonmagnetic layer 71 is disposed on the free magnetic layer 61, that the second antiferromagnetic layers 44 are disposed on the nonmagnetic layer 71, and that the electrode layers 45 are formed on the upper shield layer 44. The second antiferromagnetic layers 44 are separated from each other by a gap corresponding to the track width Tw.

The second antiferromagnetic layers 44 are composed of the same material as the second antiferromagnetic layers 42 shown in FIG. 8, and the electrode layers 45 are composed of the same material as the electrode layers 43 shown in FIG. 8.

The nonmagnetic layer 71 is composed of, for example, at least one element selected from Cu, Au, Ag, Ru, Rh, Ir, Os, and Re. When the nonmagnetic layer 71 is composed of Ru, the thickness of the nonmagnetic layer 71 is 0.8 to 1.1 nm.

The two side portions of the first free magnetic sublayer 60 are put to a single magnetic domain state and are magnetized in the track width direction by the RKKY interaction with the second antiferromagnetic layers 44. At this stage, the magnetization direction of the second free magnetic sublayer 58 is 180° opposite to the magnetization direction of the first free magnetic sublayer 60. In other words, the magnetization direction of the second free magnetic sublayer 58 is antiparallel to the X direction.

Alternatively, a pair of ferromagnetic layers separated from each other with a gap corresponding to the track width Tw therebetween may be formed between the bottom face of the second antiferromagnetic layers 44 and the nonmagnetic layer 71.

Fifth Embodiment

Figure 10:
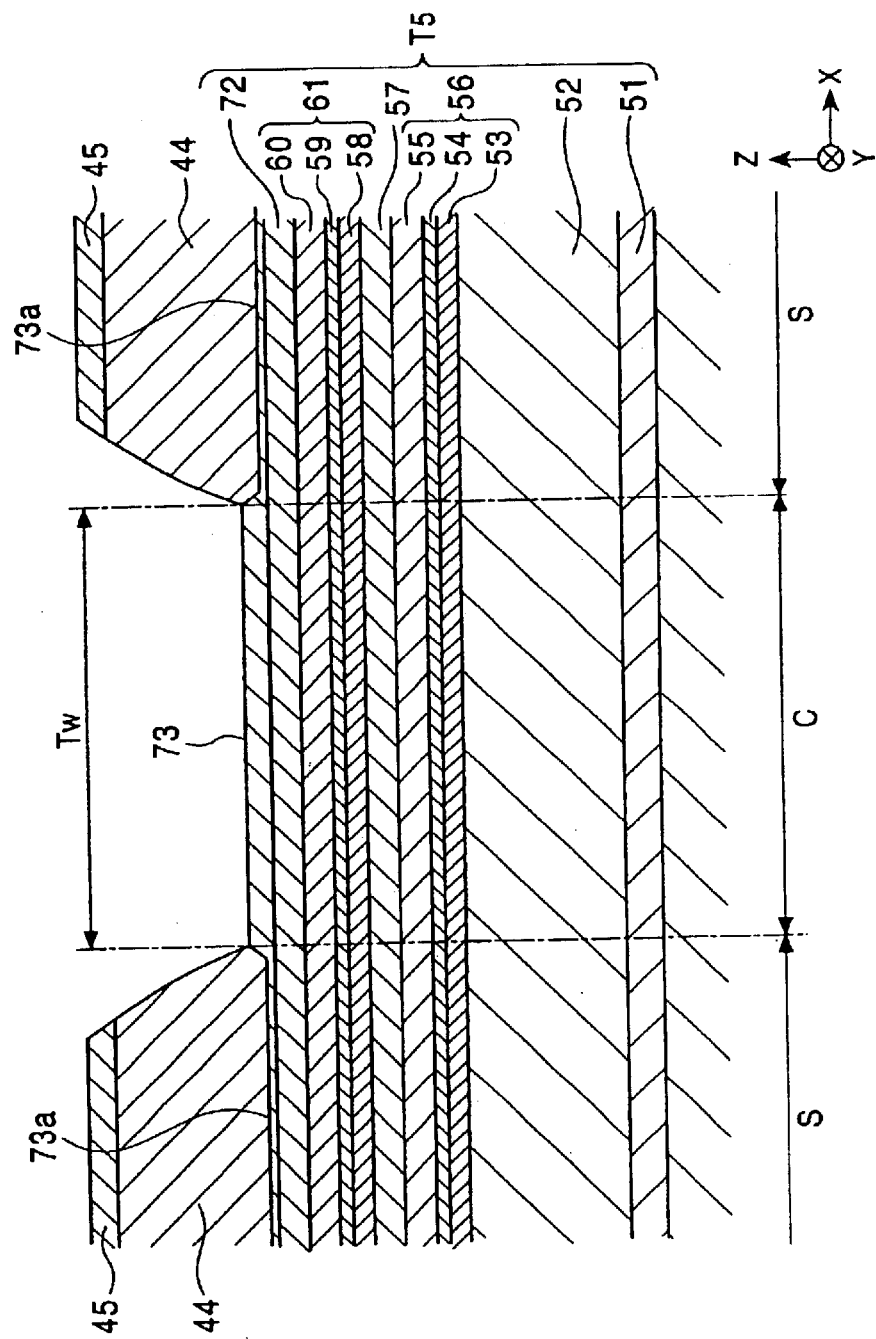
FIG. 10 is a partial enlarged view of a magnetic sensing element according to a fifth embodiment including a laminate T5.

FIG. 10 is a partial enlarged view of a magnetic sensing element showing a laminate T5, second antiferromagnetic layers 44, and electrode layers 45 near the track width region C according to the fifth embodiment of the present invention.

The laminate T5 shown in FIG. 10 differs from the laminate T3 shown in FIG. 8 in that a third antiferromagnetic layer 72 is deposited on the free magnetic layer 61, that the second antiferromagnetic layers 44 separated from each other by a gap corresponding to the track width Tw therebetween are formed on a nonmagnetic layer 73 formed on the third antiferromagnetic layer 72, and that the electrode layers 45 are formed on the second antiferromagnetic layer 44.

The thickness of the third antiferromagnetic layer 72 is preferably in the range of 20 to 50 Å, and more preferably 30 to 40 Å.

Because the thickness of the third antiferromagnetic layer 72 is small, i.e., 50 Å at most, the third antiferromagnetic layer 72 in the track width region C becomes nonantiferromagnetic. Accordingly, extremely small exchange coupling magnetic field, if any, is generated between the third antiferromagnetic layer 72 and the first free magnetic sublayer 60 in the track width region C, and the magnetization direction of the first free magnetic sublayer 60 in the track width region C is not as firmly pinned as that of the pinned magnetic layer 56.

The second antiferromagnetic layer 44 overlay two side portions 73a of the nonmagnetic layer 73. The thickness of the side portions 73a is small, i.e., 3 Å or less. (Alternatively, the side portions 73a may be completely removed by ion milling.) An antiferromagnetic interaction is generated between the second antiferromagnetic layer 44 formed on the side portions 73a and the side regions S of the third antiferromagnetic layer 72. In this manner, the second antiferromagnetic layers 44 and the side portions S of the third antiferromagnetic layer 72 can function as one antiferromagnetic layer.

As is apparent from the fifth embodiment, the present invention also encompasses an embodiment in which a layer composed of an antiferromagnetic material, the thickness thereof being so small that the layer does not exhibit antiferromagnetic property, is formed in the track width region C and in which a pair of second antiferromagnetic layers that exhibit antiferromagnetic property is formed on this antiferromagnetic material layer, the second antiferromagnetic layers being separated from each other by a gap corresponding to the track width Tw therebetween.

In the magnetic sensing elements including the structures of the above-described third to fifth embodiment shown in FIGS. 8 to 10, the length of the second antiferromagnetic layers 42 or the second antiferromagnetic layers 44 in the height direction (the Y direction) is larger than the length of the free magnetic layer 61 within the track width region C in the height direction.

Moreover, the length of the free magnetic layer 61 in the side regions S in the height direction is larger than the length of the free magnetic layer in the track width region C in the height direction.

Part of an inner end face of each of the second antiferromagnetic layers 42, the second antiferromagnetic layers 44, and the free magnetic layer 61 in the side regions S is a slope, a perpendicular plane, or a curved face extending in the height direction (the Y direction). The length of the slope, the vertical face, or the curved face in the height direction is larger than the length of the free magnetic layer 61 in the track width region C in the height direction.

This structure prevents the intensity and the magnetization direction of the exchange anisotropic magnetic field between the second antiferromagnetic layers 42 and the free magnetic layer 61 or between the second antiferromagnetic layers 44 and the free magnetic layer 61 from changing. Thus, degradation in the symmetry in output of the magnetic sensing element and a decrease in output can be effectively avoided.

FIGS. 11 to 16 show the steps of a method for fabricating the magnetic sensing element shown in FIGS. 1 to 4. Each of FIGS. 11 to 14 and 16 includes a partial plan view and a partial cross-sectional view of the structure shown in the partial plan view taken along a bold single-dotted chain line viewed in the direction of arrows. The partial plan view is depicted on the top of the partial cross-sectional view.

The layers represented by the same reference numerals as those of FIGS. 1 to 4 are composed of the same material as the corresponding layers.

Figure 11:
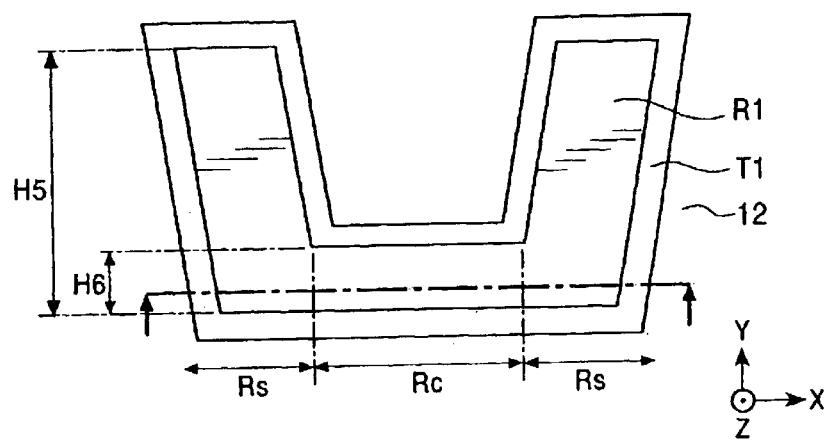
FIG. 11 includes a partial plan view and a partial cross-sectional view showing a step of a process for making the magnetic sensing element shown in FIGS. 1 to 4.
Figure 11:
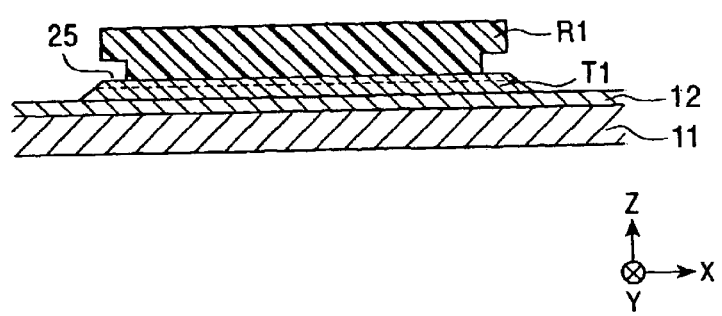

In the step shown in FIG. 11, the lower shield layer 11, the lower gap layer 12, and the laminate T1 having the multilayer structure shown in FIG. 2 are deposited on the substrate.

As shown in FIG. 2, the laminate T1 is constituted from the base layer 21, the first antiferromagnetic layer 22, the pinned magnetic layer 23, the nonmagnetic material layer 24, and the free magnetic layer 25, stacked in that order. After deposition of the laminate T1, first field annealing is performed to generate an exchange coupling magnetic field between the first antiferromagnetic layer 22 and the pinned magnetic layer 23 so as to pin the magnetization direction of the pinned magnetic layer 23 in the height direction (the Y direction).

Each of the above-described layers is formed by a thin-film forming process such as sputtering or vapor deposition.

Examples of sputtering processes include magnetoron sputtering, RF diode sputtering, RF triode sputtering, ion beam sputtering, and facing-target sputtering known in the art. Instead of the sputtering process or the vapor deposition process, a molecular beam epitaxy (MBE) process or an ion cluster beam (ICB) process may be employed to form the layers of the present invention.

Next, a resist layer RI for lift-off is formed on the laminate T1. As shown in FIG. 11, each of two side regions Rs has a length H5 in the height direction larger than a length H6 of a center region Rc in the height direction. Part of the laminate T1 not covered by the resist layer R1 is removed by ion milling or the like.

The shape of the laminate T1 in plan view is identical to that of the resist layer R1. The length of the laminate T1 in the height direction is larger in the side regions than in the center region. In other words, the length of the side regions of the free magnetic layer 25 in the height direction is lager than the length of the center region of the free magnetic layer 25 in the height direction. Part of the center region of the laminate T1 becomes the track width region C in the following steps.

Figure 12:
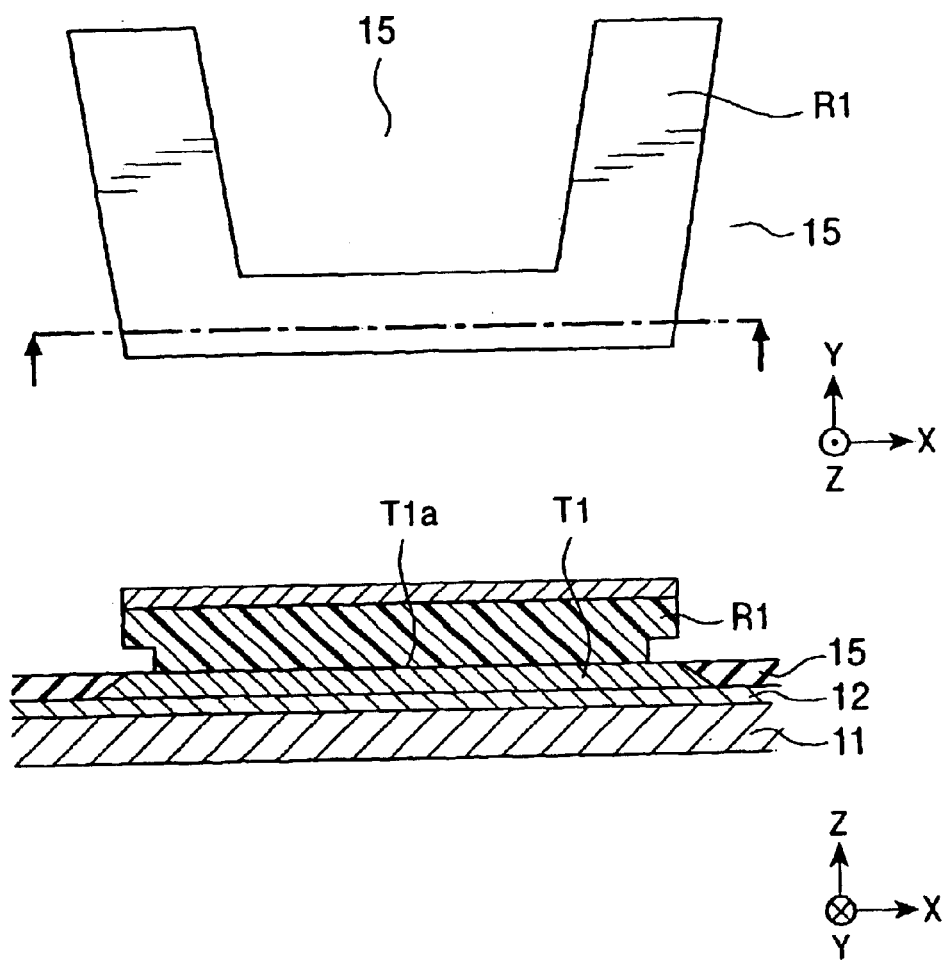
FIG. 12 includes a partial plan view and a partial cross-sectional view showing a step of a process for making the magnetic sensing element shown in FIGS. 1 to 4.

Next, in the step shown in FIG. 12, the insulating layer 15 is formed behind and at the two sides of the laminate T1. The thickness of the insulating layer 15 is approximately the same as that of the laminate T1.

Subsequently, the resist layer R1 is removed to expose a top face T1a of the laminate T1. A resist layer R2 for lift-off is formed on the laminate T1 and the insulating layer 15.

Figure 13:
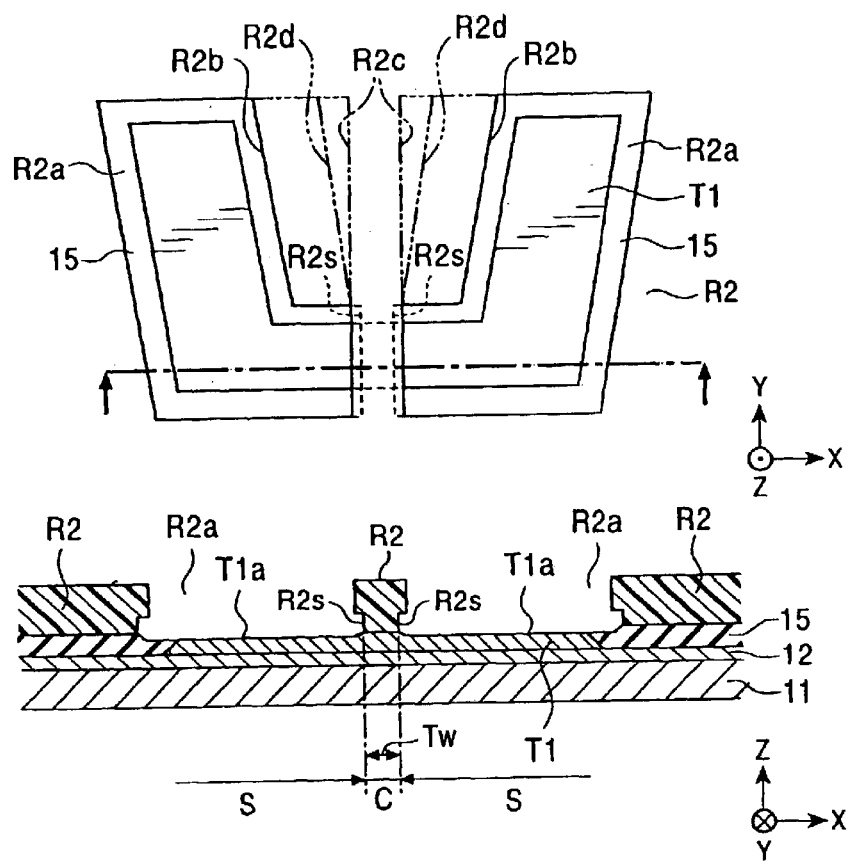
FIG. 13 includes a partial plan view and a partial cross-sectional view showing a step of a process for making the magnetic sensing element shown in FIGS. 1 to 4.

Next, as shown in FIG. 13, openings R2a exposing the whole top surface T1a of the laminate T1 except for in the track width region C are formed. When the top face of the laminate T1, i.e., the top face of the free magnetic layer 25, is oxidized, the top face is milled by ion milling or the like to remove the oxidized portion.

Figure 14:
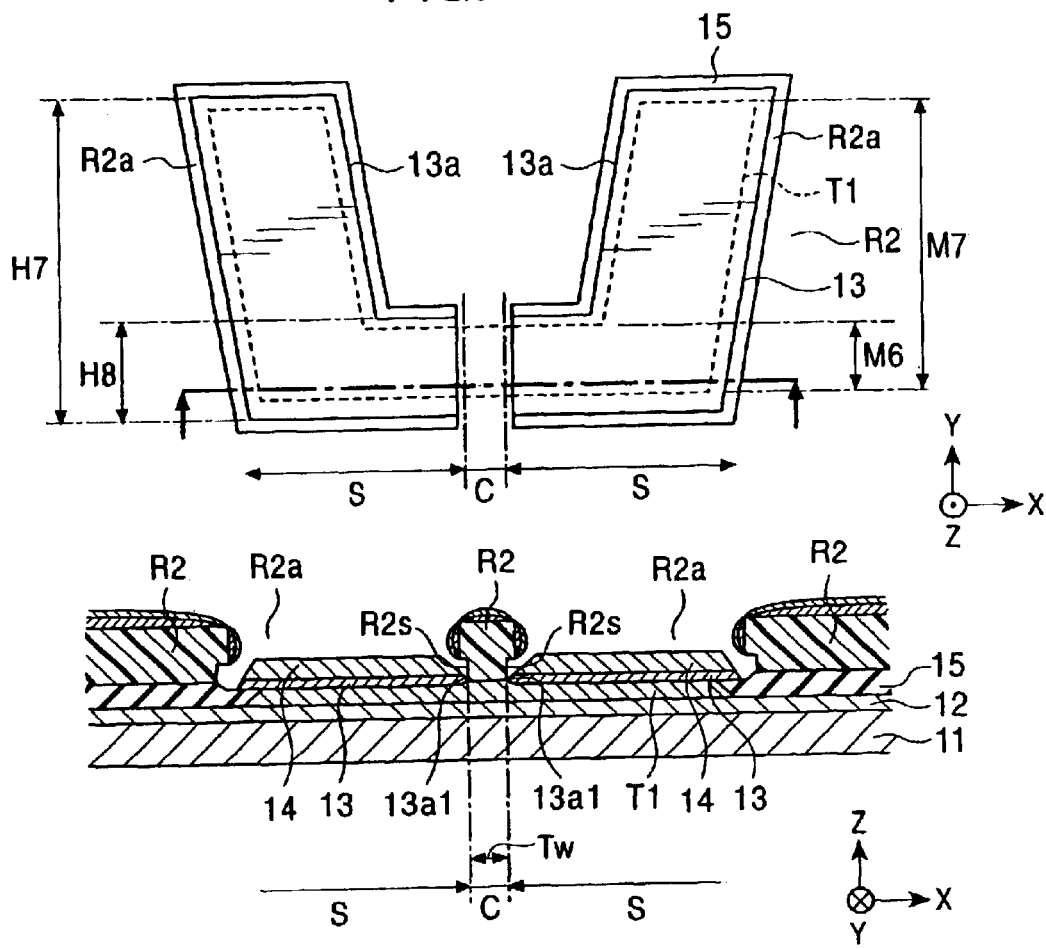
FIG. 14 includes a partial plan view and a partial cross-sectional view showing a step of a process for making the magnetic sensing element shown in FIGS. 1 to 4.

Next, as shown in FIG. 14, the second antiferromagnetic layers 13 are formed to cover the exposed top face of the laminate T1, i.e., the exposed top face of the free magnetic layer 25. The electrode layers 14 are then sequentially deposited to cover the second antiferromagnetic layer 13. Note that the electrode layers 14 are omitted from the plan view shown of FIG. 14.

As shown in FIG. 14, each of the second antiferromagnetic layers 13 has a length H7 in the height direction (the Y direction) larger than a height M6 of the laminate T1 (the free magnetic layer 25) in the track width region C.

A length M7 of the laminate T1 (the free magnetic layer 25) in the height direction in the side regions S outside the track width region C is also larger than the length M6 of the laminate T1 in the height direction in the track width region C.

As shown in FIGS. 13 and 14, the resist layer R2 has side faces R2s that are perpendicular to the X direction and extend in the height direction, i.e., the Y direction perpendicular to the track width direction. The distance between the side faces R2s is maintained at the track width Tw along the height direction. Accordingly, the slopes 13a1 of the second antiferromagnetic layers 13 are separated from each other by a gap corresponding to the track width Tw and extend in the height direction. A length H8 of the slopes 13a1 in the height direction is larger than the length M6 of the laminate T1 in the height direction in the track width region C.

Subsequent to the formation of the electrode layers 14, the resist layer R2 is removed, and the upper gap layer 16 and the upper shield layer 17 are formed.

Second field annealing is performed after the formation of the upper shield layer 17 so as to generate an exchange coupling magnetic field between the free magnetic layer 25 and the second antiferromagnetic layers 13. As a result, the magnetization directions in the two side regions of the free magnetic layer 25 are pinned perpendicular to the magnetization direction of the pinned magnetic layer 23.

The face of the magnetic sensing element that opposes a recording medium is polished to adjust the DC resistance at a predetermined value.

Note that the magnetic field applied during the second field annealing is smaller than the exchange anisotropic magnetic field between the first antiferromagnetic layer 22 and the pinned magnetic layer 23, and the annealing temperature of the second field annealing is lower than the blocking temperature of the first antiferromagnetic layer 22. In this manner, the exchange anisotropic magnetic field between the second antiferromagnetic layers 13 and the free magnetic layer 25 can be oriented in the track width direction (the X direction) while maintaining the exchange anisotropic magnetic field between the first antiferromagnetic layer 22 and the pinned magnetic layer 23 in the height direction (the Y direction).

Because the magnetic sensing element is polished to achieve a predetermined DC resistance as described above, the length H7 and the length H8 of the second antiferromagnetic layers 13 in the height direction shown in FIG. 14 should be larger than the length H1 and the length H2 of the second antiferromagnetic layers 13 in the height direction shown in FIG. 3, respectively. Similarly, the length M6 and the length M7 of the laminate T1 (the free magnetic layer 25) in the height direction shown in FIG. 14 should be larger the length M1 and the length M2 of the laminate T1 (the free magnetic layer 25) in the height direction shown in FIG. 3.

The magnetic sensing element shown in FIGS. 1 to 4 is obtained after the polishing.

In order to form the second antiferromagnetic layers 13 having inner end faces 13b shown by double-dotted chain lines in FIG. 3, the openings R2a are formed to have inner side faces R2b indicated by double-dotted chain lines in FIG. 13 during the step shown in FIG. 13. In order to form the second antiferromagnetic layers 13 having inner end faces 13c shown by triple-dotted chain lines in FIG. 3, the openings R2a are formed to have inner side faces R2d indicated by triple-dotted chain lines in FIG. 13 during the step shown in FIG. 13.

The length of the slopes 13a1 of the inner end faces 13a of the second antiferromagnetic layers 13 in the height direction can be adjusted by controlling the length of the side faces R2s of the resist layer R2 in the height direction in the track width region C.

FIGS. 15 to 18 show the steps of a method for fabricating the magnetic sensing element shown in FIGS. 5 to 7. Each of FIGS. 16 to 18 includes a partial plan view and a cross-sectional view of the structure shown in the partial plan view taken along a bold single-dotted chain line viewed in the direction of arrows. The partial plan view is depicted on the top of the partial cross-sectional view.

The layers represented by the same reference numerals as those in FIGS. 5 to 7 are composed of the same material as the corresponding layers.

Figure 16:
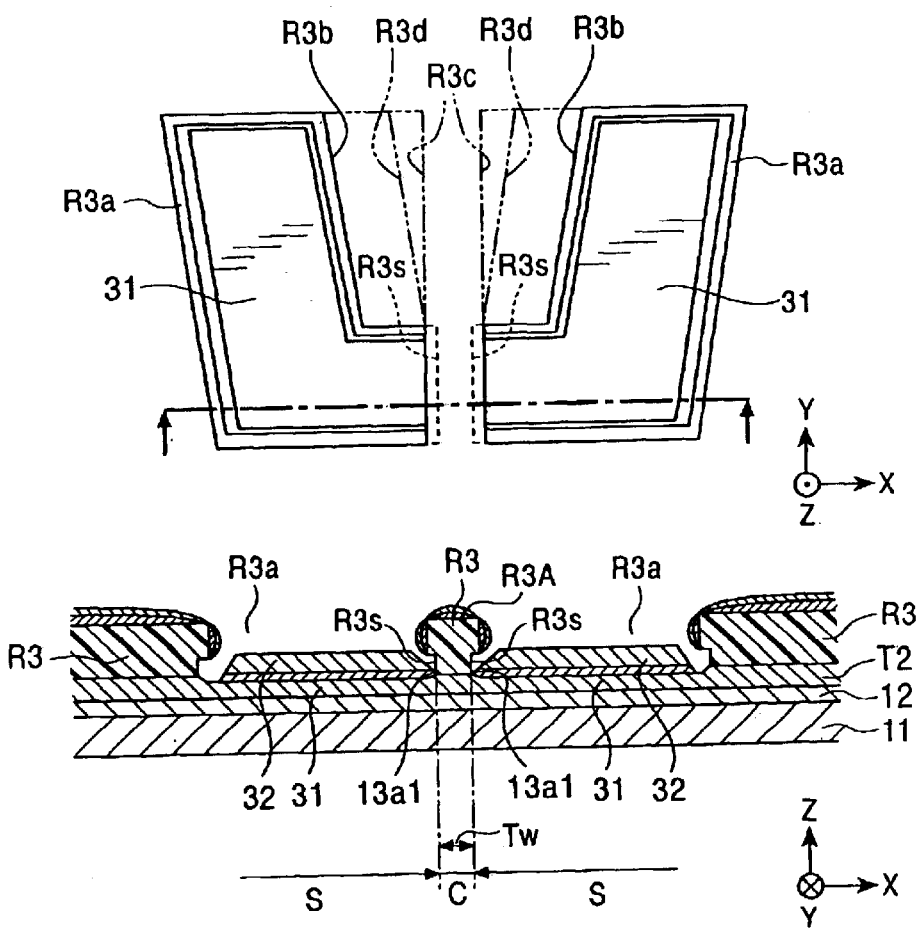
FIG. 16 includes a partial plan view and a partial cross-sectional view showing a step of a process for making the magnetic sensing element shown in FIGS. 5 to 7.

In the step shown in FIG. 16, the lower shield layer 11, the lower gap layer 12, and the laminate T2 are formed on the substrate.

As shown in FIG. 7, the laminate T2 is constituted from a base layer 80, a first antiferromagnetic layer 81, a pinned magnetic layer 82, a nonmagnetic material layer 83, and the free magnetic layer 41, stacked in that order.

After forming the laminate T2, first field annealing is performed to generate an exchange coupling magnetic field between the first antiferromagnetic layer 81 and the pinned magnetic layer 82. The generated exchange coupling magnetic field pins the magnetization direction of the pinned magnetic layer 82 in the height direction (the Y direction).

Each of the above-described layers is formed by a thin-film forming process such as sputtering or vapor deposition.

A resist layer R3 for lift-off is then formed on the laminate T2, and openings R3a are formed in the resist layer R3. A central part R3A sandwiched by the openings R3a overlays the region of the laminate T2 in the track width region C. Side faces R3s of the central part R3A are perpendicular to the top face of the laminate T2 and extend in the height direction.

If the top face of the laminate T2, i.e. the top face of the free magnetic layer 41, is oxidized, the oxidized part is removed by ion milling or the like.

Referring to FIG. 16, the second antiferromagnetic layers 31 are formed on the top face of the laminate T2 (the top face of the free magnetic layer 41) inside the openings R3a. The electrode layers 32 are then sequentially formed on the second antiferromagnetic layers 31 so as to completely cover the second antiferromagnetic layers 31. The thickness of the electrode layers 32 should be larger than that of the laminate T2. In particular, the electrode layers 32 are formed to have a thickness of 1,000 to 1,500 Å or 500 to 1,500 Å. Note that the electrode layers 32 are omitted from the plan view in FIG. 16.

The side faces R3s of the central part R3A extend in the height direction and are perpendicular to the top face of the laminate T2; accordingly, the slopes 31a1 that extend in the height direction with a gap corresponding to the track width Tw therebetween are formed in the second antiferromagnetic layers 31.

During sputtering for forming the second antiferromagnetic layers 31, the length of the slopes 31a1 in the height direction is adjusted in the range of 1 μm to 10 μm. Since the step of polishing the opposing face of the magnetic sensing element will be performed at the end of the manufacturing process to adjust the DC resistance of the magnetic sensing element, the length of the slope 31a1 in the height direction are preferably determined considering the amount removed by the polishing.

The resist layer R3 is then removed. The resulting second antiferromagnetic layers 31 are separated from each other in the track width direction by a gap corresponding to the track width Tw therebetween.

Second field annealing is then performed after formation of the second antiferromagnetic layers 31 and the electrode layers 32 so as to generate exchange coupling magnetic fields between the second antiferromagnetic layers 31 and the free magnetic layer 41. The generated exchange coupling magnetic fields pin the magnetization directions in the two side regions of the free magnetic layer 41 in a direction orthogonal to the magnetization direction of the pinned magnetic layer 82.

During the second field annealing, the applied magnetic field is smaller than the exchange anisotropic magnetic field between the first antiferromagnetic layer 22 and the pinned magnetic layer 23. The annealing temperature during the second field annealing is lower than the blocking temperature of the first antiferromagnetic layer 22. In this manner, the exchange anisotropic magnetic fields between the second antiferromagnetic layers 31 and the free magnetic layer 41 can be oriented in the track width direction (the X direction) while maintaining the exchange anisotropic magnetic field between the first antiferromagnetic layer 22 and the pinned magnetic layer 23 in the height direction (the Y direction).

Figure 17:
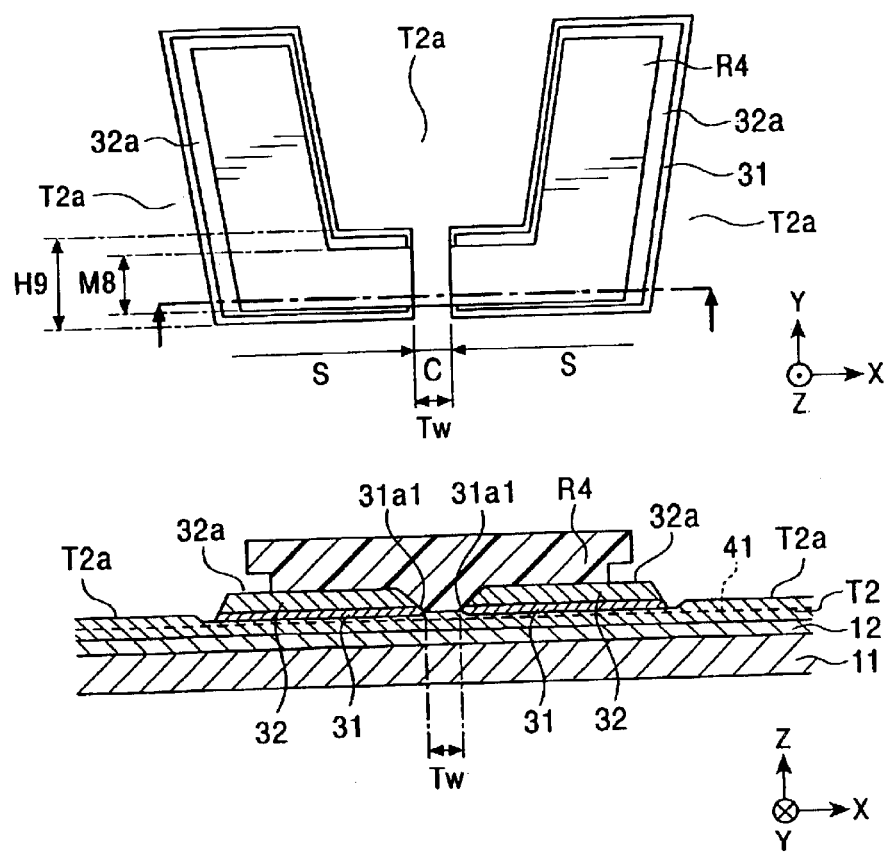
FIG. 17 includes a partial plan view and a partial cross-sectional view showing a step of a process for making the magnetic sensing element shown in FIGS. 5 to 7.

Next, as shown in FIG. 17, a resist layer R4 is formed, by patterning, on the electrode layers 32 and the free magnetic layer 41 in the track width region C. Part of the resist layer R4 on the electrode layers 32 has the same shape as the electrode layers 32 or formed within the regions of the electrode layers 32. A length H9 of the slope 31a1 of the second antiferromagnetic layers 31 in the height direction is formed to be larger than a length M8 of the resist layer R4 in the height direction in the track width region C. In other words, the length M8 is the length of the masked portion of the free magnetic layer in the height direction.

Figure 18:
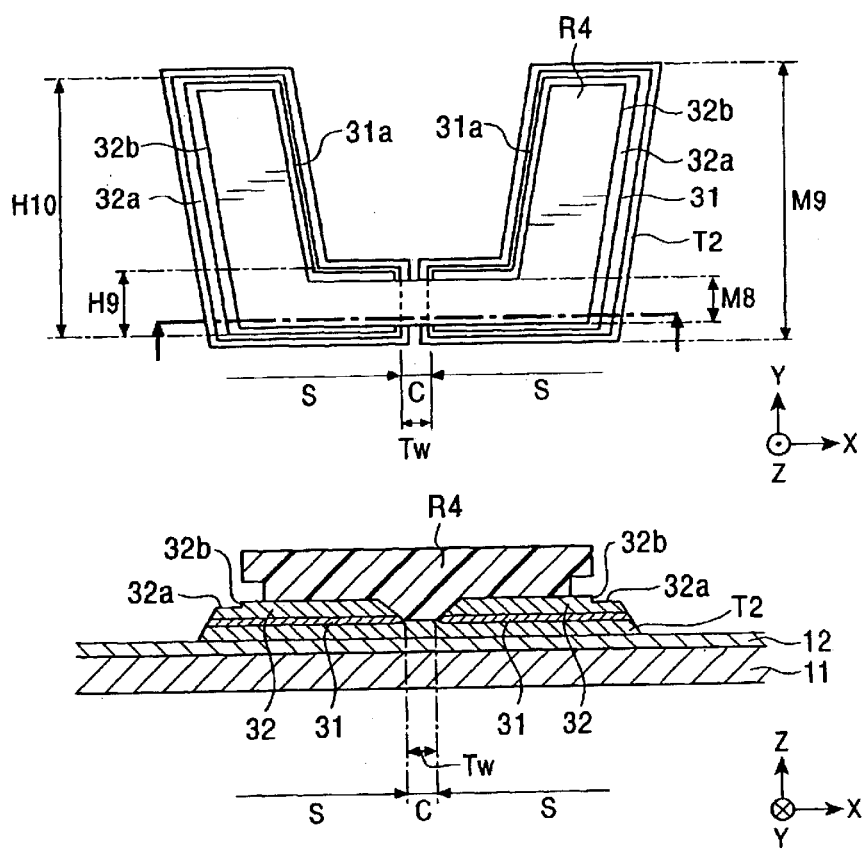
FIG. 18 includes a partial plan view and a partial cross-sectional view showing a step of a process for making the magnetic sensing element shown in FIGS. 5 to 7.

Next, as shown in FIG. 18, the portion of the laminate T2 not masked by the resist layer R4 is removed by ion milling.

During the ion milling, the portion of the laminate T2 not covered by the electrode layers 32 and by the second antiferromagnetic layers 31 is completely removed.

Regions 32a of the electrode layers 32 not covered by the resist layer R4 are partly milled to form step differences 32b. The portion of the laminate T2 covered with the electrode layers 32 and the second antiferromagnetic layers 31 does not suffer from thinning during the ion milling because it is protected by the electrode layer 32 and the second antiferromagnetic layer 31.

Accordingly, the free magnetic layer 41 formed under the second antiferromagnetic layer 31 is formed to have the inner end faces 41a, part of each inner end face 41a in the track width region C constituting the slope 41a1 that extends in the height direction.

By the step shown in FIG. 18, a length H9 of the second antiferromagnetic layers 31 in the height direction (the Y direction) in the side regions S becomes larger than a length M8 of the laminate T2 in the height direction in the track width region C (in other words, a length M8 of the free magnetic layer 41 in the height direction in the track width region C).

A length H9 of the laminate T2 in the height direction in the side regions S also becomes larger than the length M9 of the laminate T2 in the height direction in the track width region C.

The length H9 of the slopes 31a1 of the second antiferromagnetic layer 31 is larger than the length M8 of the laminate T2 (the free magnetic layer 41) in the height direction in the track width region C.

The resist layer R4 is then removed, and the upper gap layer 16 and the upper shield layer 17 are formed. Note that the portions removed by the ion milling may be back-filled with an insulating material such as alumina before removing the resist layer R4.

After the upper shield layer 17 is formed, the magnetic sensing element is polished from the opposing-face-side so as to adjust the DC resistance to a predetermined value.

Since the polishing step is provided as above, the length H9 and the length H10 of the second antiferromagnetic layer 31 in the height direction shown in FIG. 18 should be larger than the length H3 and the H4 of the second antiferromagnetic layers 31 in the height direction shown in FIG. 6, respectively. Similarly, the length M8 and the length M9 of the laminate T2 (the free magnetic layer 41) in the height direction in FIG. 18 should be larger than the length M3 and M4 of the laminate T2 in the height direction shown in FIG. 6, respectively.

The magnetic sensing element shown in FIGS. 5 to 7 is obtained after the polishing.

Figure 15:
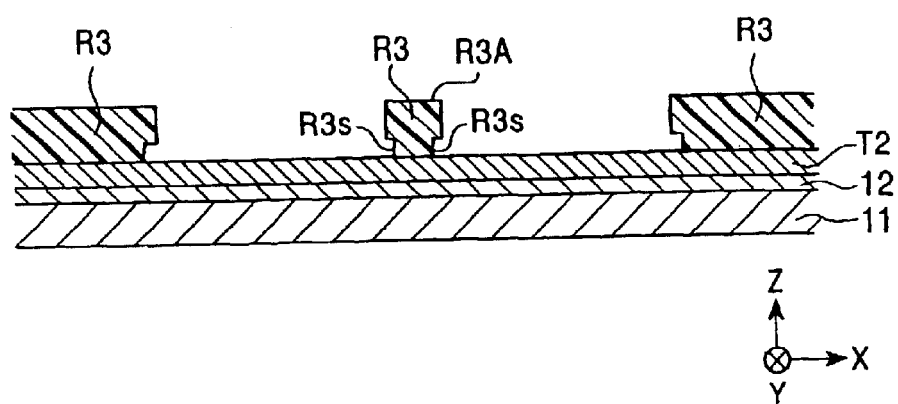
FIG. 15 includes a partial plan view and a partial cross-sectional view showing a step of a process for making the magnetic sensing element shown in FIGS. 5 to 7.

Note that in order to form the second antiferromagnetic layers 31 having inner end faces constituted from the slopes 31b shown by double-dotted chain lines in FIG. 6, the openings R3a are formed to have the shape indicated by double-dotted lines R3c shown in FIG. 16 during the steps shown in FIGS. 15 and 16. In order to form the second antiferromagnetic layers 31 having inner end faces constituted from the slopes 31c shown by triple-dotted chain lines in FIG. 6, the openings R3a are formed to have the shape indicated by triple-dotted lines R3d shown in FIG. 16 during the steps shown in FIGS. 15 and 16.

The lengths of the slopes 31a1 and the slopes 41a1 in the height direction can be adjusted by controlling the length of the side faces R3s of the resist layer R3 in the height direction in the track width region C.

Sixth Embodiment

Figure 19:
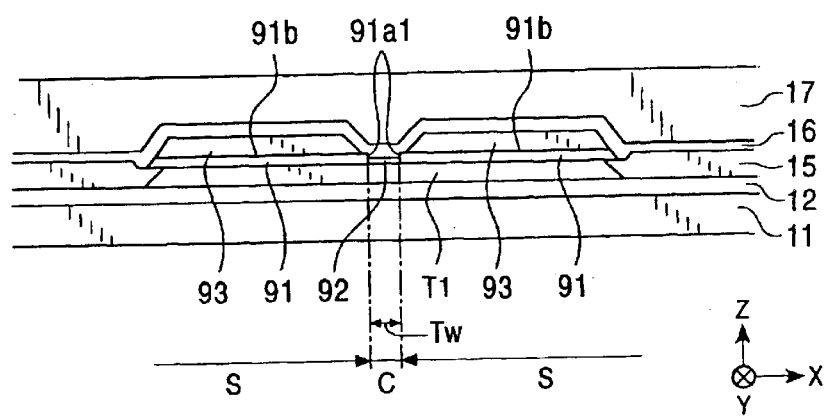
FIG. 19 is a partial front view showing a magnetic sensing element according to a sixth embodiment of the present invention.

FIG. 19 is a partial front view of a magnetic sensing element of a sixth embodiment of the present invention viewed from the face that opposes a recording medium (hereinafter this face is referred to as the "opposing face").

The magnetic sensing element shown in FIG. 19 includes the lower shield layer 11, the lower gap layer 12, the laminate T1, and the insulating layer 15 same as those of the magnetic sensing element shown in FIG. 1.

In this embodiment, a pair of second antiferromagnetic layers 91 is deposited on the laminate T1, i.e., on the free magnetic layer 25, as shown in FIG. 19. Each of the second antiferromagnetic layers 91 has an inner end face 91a, and part of the inner end face 91a constitutes a vertical surface 91a1, which extends in the height direction (the Y direction) and which is perpendicular to a top face 91b of the second antiferromagnetic layer 91.

The magnetic sensing element shown in FIG. 19 includes a layer 92 composed of an antiferromagnetic material disposed between the vertical surfaces 91a1. The layer 92 has a thickness in the range of 20 to 50 Å, and more preferably in the range of 30 to 40 Å, and does not exhibit antiferromagnetic property; hence the magnetization direction of the free magnetic layer 25 is not pinned at this position. The thickness of the second antiferromagnetic layers 91 in the side regions S outside the track width region C is in the range of 80 to 500 Å.

The second antiferromagnetic layers 91 are formed by first depositing an antiferromagnetic material layer having a uniform thickness in the range of 80 to 500 Å on the entire top face of the laminate T1 and then milling only the track width region C in a perpendicular manner.

A pair of electrode layers 93 is formed on the second antiferromagnetic layers 91. The upper gap layer 16 and the upper shield layer 17 are formed to cover the electrode layers 93. The materials of the second antiferromagnetic layers 91 and the electrode layers 93 are the same as those of the second antiferromagnetic layers 13 and the electrode layers 14 shown in FIGS. 1 to 4, respectively.

Figure 20:
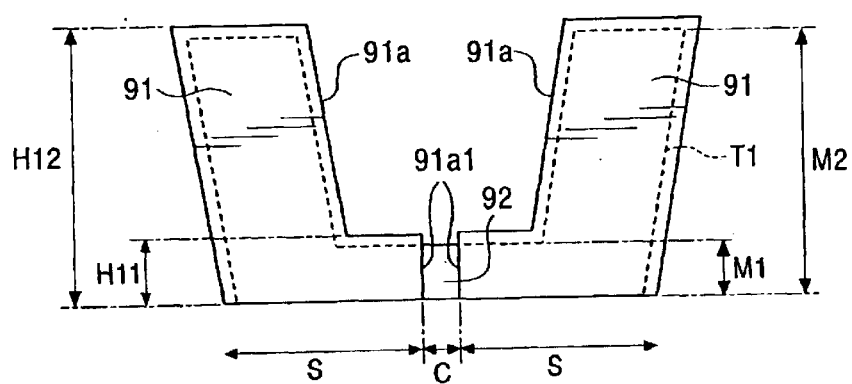
FIG. 20 is a partial plan view of the magnetic sensing element of the third embodiment.

FIG. 20 is a plan view of the magnetic sensing element shown in FIG. 19 viewed from above. The upper shield layer 17, the upper gap layer 16, and the electrode layers 93 are omitted from the drawing in FIG. 20.

In this embodiment, a length H11 of each vertical surface 91a1 in the height direction is larger than the length M1 of the free magnetic layer 25 in the height direction in the track width region C.

The length H11 of the vertical surface 91a1 is preferably 1 μm or more, and more preferably 1.5 μm or more. The length M1 of the free magnetic layer 25 in the height direction in the track width region C is, for example, 0.2 μm.

A length H12 of the second antiferromagnetic layers 91 in the height direction (the Y direction) is larger than the length M1 of the free magnetic layer 25, i.e., the topmost layer of the laminate T1, in the height direction in the track width region C.

A length H12 of the second antiferromagnetic layers 91 in the height direction (the Y direction) is larger than the length M1 of the free magnetic layer 25, i.e., the topmost layer of the laminate T1, in the track width region C.

Accordingly, the magnetic sensing element shown in FIG. 19 has the same advantages as those of the magnetic sensing element shown in FIG. 1.

Alternatively, as in the magnetic sensing element of the second embodiment shown in FIGS. 5 to 7, part of the inner end face of the free magnetic layer overlaid by the second antiferromagnetic layers 91 may be a vertical face that extends in the height direction (the Y direction), the vertical face being perpendicular to the top faces 91b of the second antiferromagnetic layers 91.

An inductive head may be formed on the upper shield layer 17 of the magnetic sensing element of each embodiment so as to form an integrated magnetic head.

EXAMPLES

As described above, the magnetic sensing element of the second embodiment includes the second antiferromagnetic layers 31 having the inner end faces 31a with the slopes 31a1 that extend in the height direction. The magnetic sensing element of the second embodiment also includes the free magnetic layer 41 having the inner end faces 41a with the slopes 41a1 extending in the height direction.

In EXAMPLES, the relationships between the length H3 of the slopes 31a1 in the height direction and the resistance to soft ESD and between the length H3 and side reading were examined.

Figure 21:
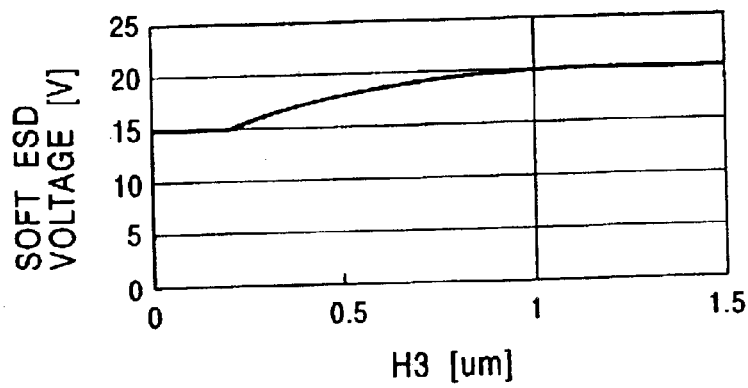
FIG. 21 is a graph showing the relationship between the length of slopes of second antiferromagnetic layers in the height direction and the soft ESD resistance.

FIG. 21 is a graph showing the soft ESD resistance of the magnetic sensing element versus the length H3 of the slopes 31a1 of the second antiferromagnetic layers 31 in the height direction.

Soft electrostatic discharge damage (ESD) refers to the following phenomena. When an magnetic sensing element comes into contact with a charged object or when a transient current flows during switching, heat is generated at the junctions between the second antiferromagnetic layers and the free magnetic layer. Moreover, due to the transient current, a magnetic field is produced and the produced magnetic field changes the direction and the intensity of the exchange anisotropic magnetic fields between the second antiferromagnetic layers and the free magnetic layer. This results in degradation in symmetry of the output of the magnetic sensing element and in a decrease in output, i.e., soft electrostatic discharge damage (ESD).

A soft ESD resistance test was performed with a human body model.

In the test, a charged capacitor C was connected in series to a DC resistance R and a magnetic sensing element so as to supply a pulse current to the magnetic sensing element. This arrangement simulated the state when the magnetic sensing element came into contact with a charge object or when a transient current flew during switching, and the change in asymmetry of the magnetic sensing element was be examined. In the human body model test, the DC resistance R was 1.5 kΩ, the capacitance of the capacitor C was 100 pF, the maximum instantaneous current was 10 mA, and the supplied pulse current had a pulse half width of 0.1 to 1 microsecond.

While applying the above-described pulse current to the magnetic sensing element, the voltage that can control the change in asymmetry of the magnetic sensing element to 10% or less was examined. The results are shown in FIG. 21.

The graph in FIG. 21 demonstrates that when the length H3 of the slopes 31a1 of the second antiferromagnetic layers 31 was less than 1 μm, the voltage that can control the change in asymmetry to 10% or less increased as the length H3 in the height direction increased. In other words, the soft ESD resistance increased as the length H3 in the height direction increased.

When the length H3 in the height direction was 1 μm or more, the voltage that can control the change in asymmetry to 10% or less was maximized, i.e., the voltage was 20 V.

The results show that the soft ESD resistance can be maximized by adjusting the length H3 of the slopes 31a1 in the height direction to 1 μm or more.

Figure 22:
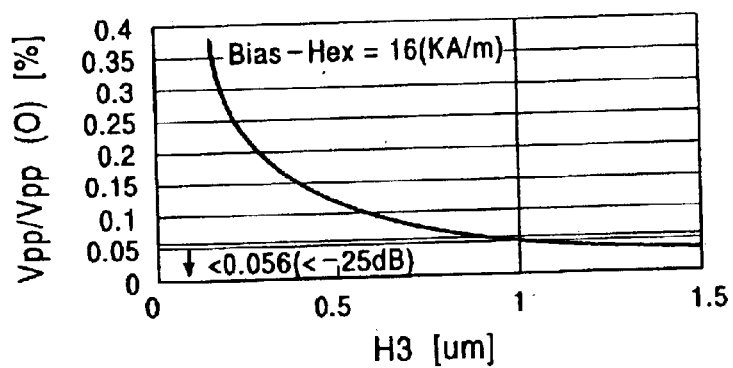
FIG. 22 is a graph showing the relationship between the length of the slopes in the second antiferromagnetic layers in the height direction and side reading.

FIG. 22 shows the ratio of side reading versus the length H3 of the slopes 31a1 of the second antiferromagnetic layers 31 in the height direction. The term "side reading" means detection of a magnetic field at regions other than the track width region C of the magnetic sensing element.

The intensity of the exchange anisotropic magnetic field between the second antiferromagnetic layers 31 and the free magnetic layer 25 was set to 16 kA/m, and the length H3 of the slopes 31a1 in the height direction was varied. The ratio of the voltage change Vpp at the two side regions S of the free magnetic layer 25 to the voltage change Vpp (0) at the track width region C was examined.

FIG. 22 demonstrates that the voltage change of the free magnetic layer 25 in the side regions relative to the voltage change of the free magnetic layer 25 in the track width region C decreased as the length H3 of the slopes 31a1 in the height direction increased. Thus, the ratio of side reading was reduced.

Generally, in the field of magnetic sensing elements, the ratio of side reading is preferably −25 dB or less. The side reading ratio was −25 dB or less when the voltage change in the side regions of the free magnetic layer 25 relative to the voltage change in the track width region C was 0.056 or less. According to the graph of FIG. 22, the corresponding length H3 of the slopes 31a1 in the height direction is 1 μm or more.

Thus, in the magnetic sensing element, the ratio of side reading can be adjusted to −25 dB or less by controlling the length H3 of the slopes 31a1 in the height direction to 1 μm or more.

Figure 23:
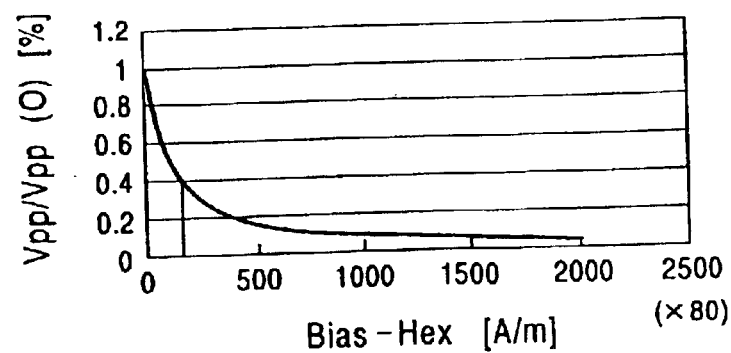
FIG. 23 is a graph showing the relationship between an exchange anisotropic magnetic field between the second antiferromagnetic layers and the free magnetic layer and side reading.
Figure 24:
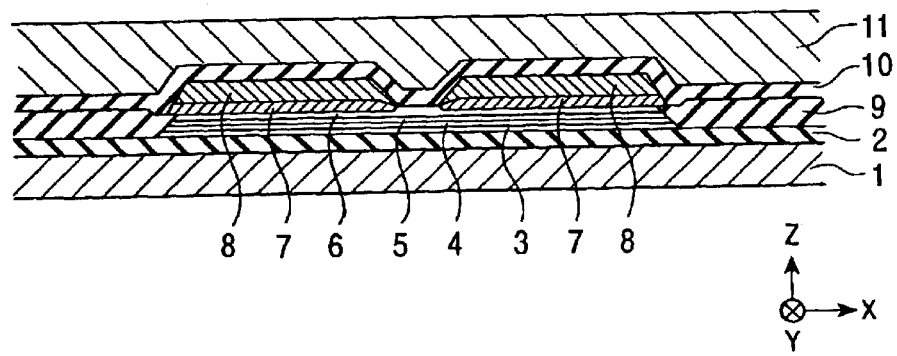
FIG. 24 is a partial cross-sectional view of a conventional magnetic sensing element.
Figure 25:
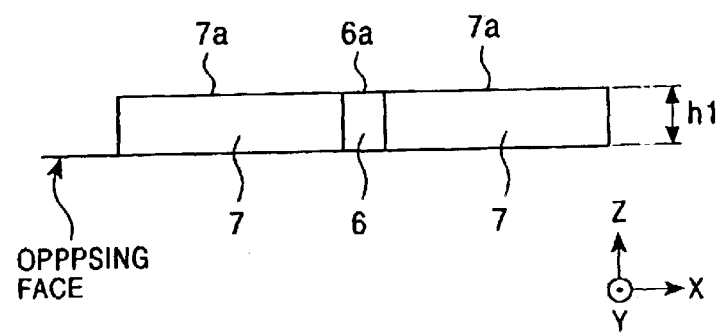
FIG. 25 is a partial plan view of the conventional magnetic sensing element.

FIG. 23 is a graph showing the ratio of the voltage change in the side regions S of the free magnetic layer 25 to the voltage change in the track width region C of the free magnetic layer 25 versus the intensity of the exchange anisotropic magnetic field between the second antiferromagnetic layers 31 and the free magnetic layer 25. The length H3 of the slopes 31a1 in the height direction was fixed to 0.15 μm.

Referring to FIG. 23, the ratio of the voltage change Vpp in the side regions S of the free magnetic layer 25 to the voltage change Vpp (0) in the track width region C of the free magnetic layer 25 was 0.4 when the H3 was 0.15 μm at an exchange anisotropic magnetic field between the second antiferromagnetic layers 31 and the free magnetic layer 25 of 16 kA/m. The magnetic sensing element cannot be put to practical use since the ratio of 0.4 renders a side reading ratio markedly exceeding −25 dB.

As is apparent from FIG. 22, when the length H3 of the slopes 31a1 in the height direction is increased to 1 μm or more, the side reading ratio of the magnetic sensing element can be decreased to −25 dB or less even when the exchange anisotropic magnetic field between the second antiferromagnetic layers 31 and the free magnetic layer 25 is 16 kA/m.

The above-described examples fully demonstrate that when the length H3 of the slopes 31a1 in the height direction is large as in the present invention, the magnetic sensing element exhibits a low side reading ratio even when the exchange anisotropic magnetic field between the second antiferromagnetic layers 31 and the free magnetic layer 25 is small.

It should be noted that, as is apparent from FIG. 7, when the length of the slopes 31a1 of the second antiferromagnetic layer 31 in the height direction is 1 μm or more, the length of the slopes 41a1 of the free magnetic layer 41 in the height direction is also 1 μm or more.

It should also be noted that various modifications are possible without departing from the scope of the present invention. The above-described embodiments are examples and do not limit the scope of the present invention.

What is claimed is:

1. A magnetic sensing element comprising:
   a laminate comprising;
   a first antiferromagnetic layer;
   a pinned magnetic layer on the first antiferromagnetic layer;
   a nonmagnetic material layer on the pinned magnetic layer; and
   a free magnetic layer on the nonmagnetic material layer; and
   a pair of second antiferromagnetic layers on the free magnetic layer, the second antiferromagnetic layers being separated from each other in a track width direction by a gap therebetween,
   wherein a length of the second antiferromagnetic layers in a height direction is larger than a length of the free magnetic layer in the height direction in a track width region.

2. The magnetic sensing element according to claim 1, wherein at least part of an inner end face of each of the second antiferromagnetic layers is a vertical face, a curved face, or a slope that extends in the height direction, in which the vertical faces, the curved faces, or the slopes of the second antiferromagnetic layers are separated from each other with a gap corresponding to a track width therebetween, and
   wherein a length of the vertical faces, the curved faces, or the slopes in the height direction is larger than the length of the free magnetic layer in the height direction in the track width region.

3. The magnetic sensing element according to claim 2, wherein the vertical faces, the curved faces, or the slopes of the second antiferromagnetic layers have a length in the height direction of 1 $\mu$m or more.

4. The magnetic sensing element according to claim 2, wherein the vertical faces, the curved faces, or the slopes of the second antiferromagnetic layers have a length in the height direction of 10 $\mu$m or less.

5. The magnetic sensing element according to claim 1, wherein the length of the free magnetic layer in the height direction at side regions at lateral sides of the track width region is larger than the length at the free magnetic layer in the height direction in the track width region.

6. The magnetic sensing element according to claim 5, wherein at least part of an inner end face of the free magnetic layer at the side regions is a vertical face, a curved face, or a slope that extends in the height direction,
   wherein a length of the vertical face, the curved face, or the slope of the free magnetic layer in the height direction is larger than the length of the free magnetic layer in the height direction in the track width region.

7. The magnetic sensing element according to claim 6, wherein the vertical face, the curved face, or the slope of the free magnetic layer has a length in the height direction of 1 $\mu$m or more.

8. The magnetic sensing element according to claim 6, wherein the vertical, the curved face, or the slope of the free magnetic layer has a length in the height direction of 10 $\mu$m or less.

9. The magnetic sensing element according to claim 1, wherein the second antiferromagnetic layers completely cover portions of the free magnetic layer at side regions.

10. The magnetic sensing element according to claim 1, further comprising electrode layers on the second antiferromagnetic layers, the electrode layers comprising a conductive material having a resistivity lower than that an antiferromagnetic material of the second antiferromagnetic layers.

11. The magnetic sensing element according to claim 10, wherein the electrode layers completely cover top faces of the second antiferromagnetic layers.

12. The magnetic sensing element according to claim 1, wherein a thickness of the second antiferromagnetic layers or a thickness electrode layers at side regions is smaller in region behind a rear end face of the free magnetic layer in the height direction than in regions from a face of the magnetic sensing element opposing a recording medium up to the rear end face of the free magnetic layer.

* * * * *

UNITED STATES PATENT AND TRADEMARK OFFICE
CERTIFICATE OF CORRECTION

PATENT NO. : 6,867,952 B2
DATED : March 15, 2005
INVENTOR(S) : Naoya Hasegawa

It is certified that error appears in the above-identified patent and that said Letters Patent is hereby corrected as shown below:

Column 32,
Line 2, after "the length" delete "at" and substitute -- of -- in its place.
Line 35, after "thickness" insert -- of --.

Signed and Sealed this

Eighteenth Day of October, 2005

JON W. DUDAS
*Director of the United States Patent and Trademark Office*